US010474780B2

(12) United States Patent
Valcore, Jr. et al.

(10) Patent No.: US 10,474,780 B2
(45) Date of Patent: *Nov. 12, 2019

(54) SEGMENTING A MODEL WITHIN A PLASMA SYSTEM

(71) Applicant: Lam Research Corporation, Fremont, CA (US)

(72) Inventors: John C. Valcore, Jr., Fremont, CA (US); Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 113 days.

This patent is subject to a terminal disclaimer.

(21) Appl. No.: 15/718,461

(22) Filed: Sep. 28, 2017

(65) Prior Publication Data

US 2018/0018418 A1 Jan. 18, 2018

Related U.S. Application Data

(63) Continuation of application No. 14/245,803, filed on Apr. 4, 2014, now Pat. No. 9,779,196, which is a continuation-in-part of application No. 13/756,390, filed on Jan. 31, 2013, now Pat. No. 9,502,216.

(60) Provisional application No. 61/821,523, filed on May 9, 2013.

(51) Int. Cl.
*G06F 17/50* (2006.01)

(52) U.S. Cl.
CPC ................ *G06F 17/5063* (2013.01)

(58) Field of Classification Search
None
See application file for complete search history.

(56) References Cited

U.S. PATENT DOCUMENTS

| 5,175,472 A | 12/1992 | Johnson, Jr. et al. |
| 9,779,196 B2 * | 10/2017 | Valcore, Jr. ......... G06F 17/5063 |
| 2005/0067386 A1 | 3/2005 | Mitrovic |

* cited by examiner

*Primary Examiner* — Roy Y Yi
(74) *Attorney, Agent, or Firm* — Penilla IP, APC

(57) ABSTRACT

Systems and methods for segmenting an impedance matching model are described. One of the methods includes receiving the impedance matching model. The impedance matching model represents an impedance matching circuit, which is coupled to an RF generator via an RF cable and to a plasma chamber via an RF transmission line. The method further includes segmenting the impedance matching model into two or more modules of a first set. Each module includes a series circuit and a shunt circuit. The shunt circuit is coupled to the series circuit. The series circuit of the first module is coupled to a cable model and the series circuit of the second module is coupled to an RF transmission model. The series circuit and the shunt circuit of the first module are coupled to the series circuit of the second module. The shunt circuit of the second module is coupled to the RF transmission model.

29 Claims, 14 Drawing Sheets

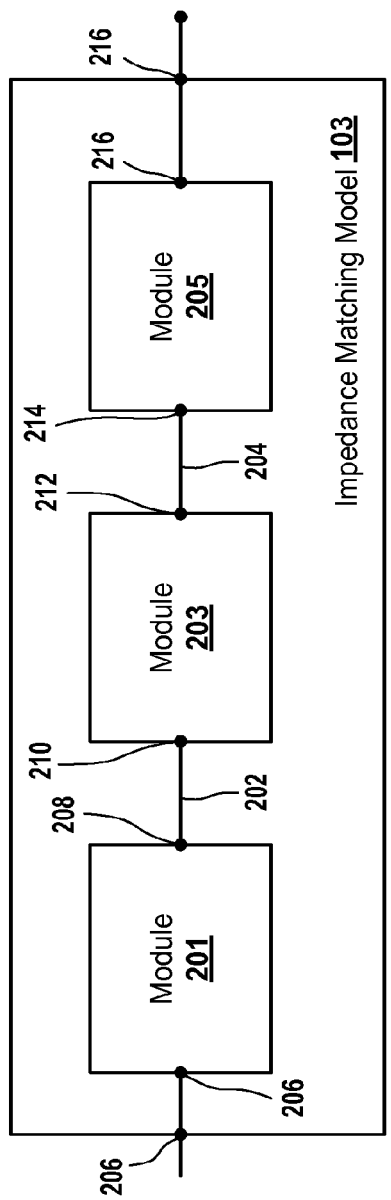
Fig. 2
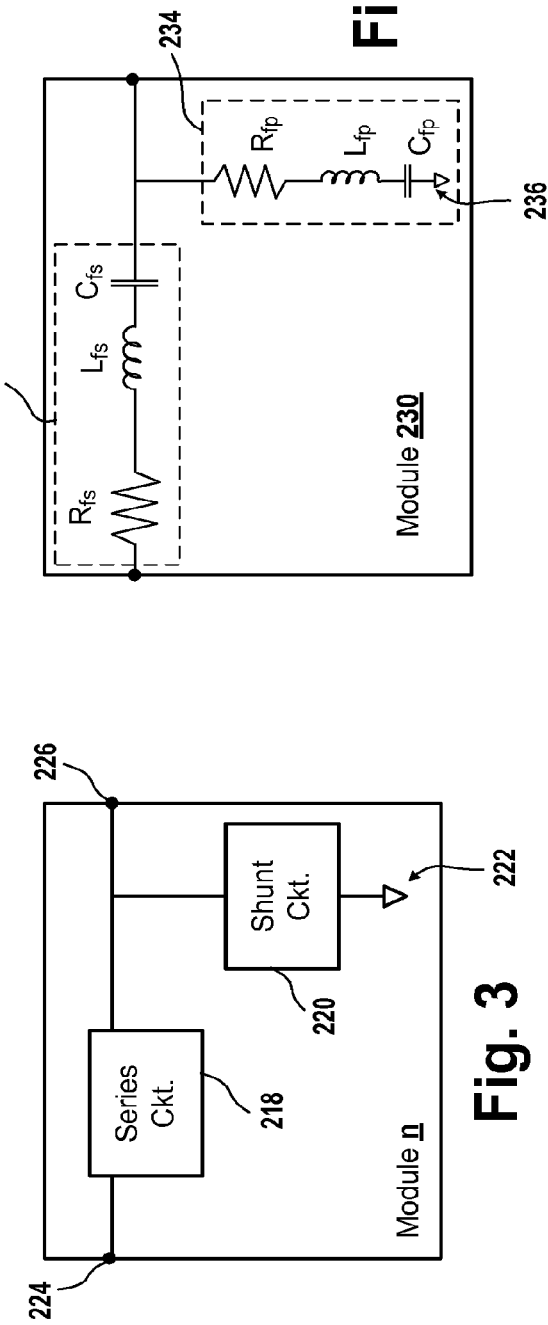
Fig. 4A
Fig. 3

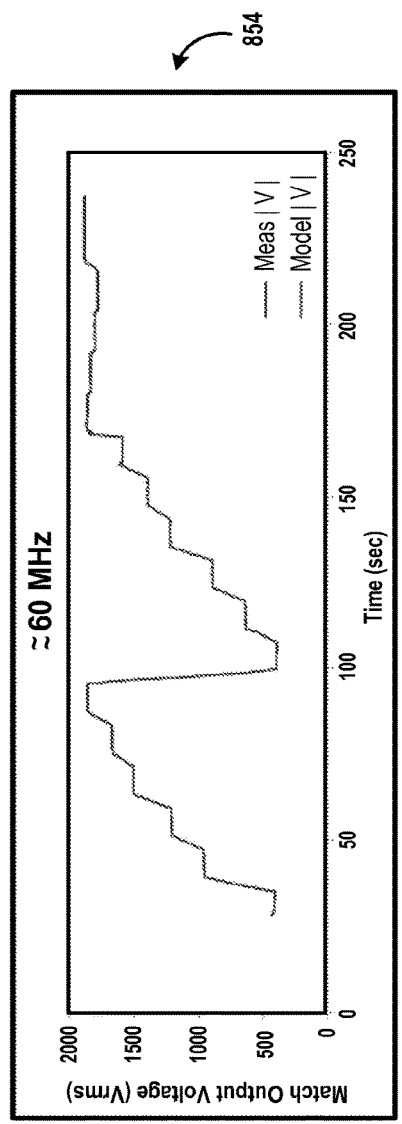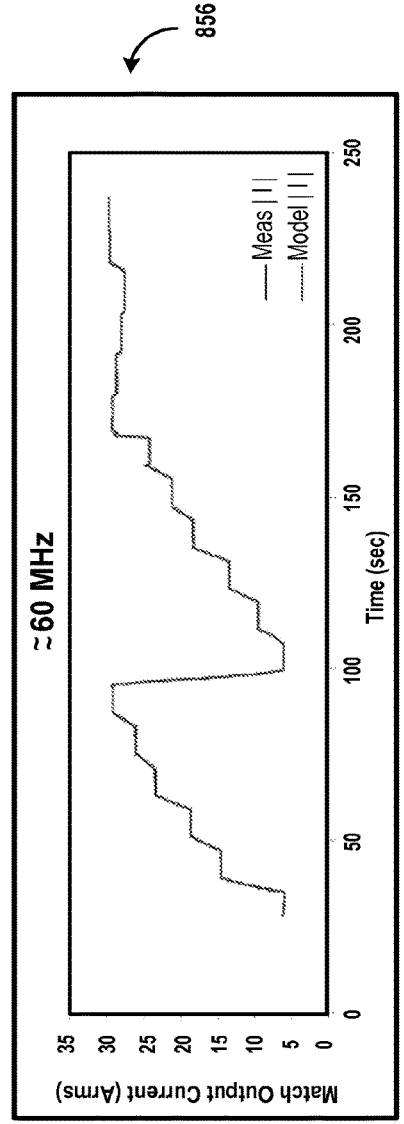
Fig. 12A
Fig. 12B

SEGMENTING A MODEL WITHIN A PLASMA SYSTEM

CLAIM OF PRIORITY

This application is a continuation of and claims the benefit of and priority, under 35 U.S.C. § 120, to U.S. patent application Ser. No. 14/245,803, filed on Apr. 4, 2014, and titled "Segmenting a Model Within a Plasma System", which claims the benefit of and priority, under 35 U.S.C. § 119(e), to U.S. Provisional Patent Application No. 61/821, 523, filed on May 9, 2013, and titled "Segmenting a Model Within a Plasma System", both of which are hereby incorporated by reference in their entirety This U.S. patent application Ser. No. 14/245,803 is a continuation-in-part (CIP) of and claims the benefit of and priority, under 35 U.S.C. § 120, to U.S. patent application Ser. No. 13/756,390, filed on Jan. 31, 2013, and titled "Using Modeling to Determine Wafer Bias Associated with a Plasma System", now issued as U.S. Pat. No. 9,502,216, which is hereby incorporated by reference in its entirety.

FIELD

The present embodiments relate to generating segments of a model within a plasma system.

BACKGROUND

A plasma-based system is used to perform a variety of operations. For example, the plasma-based system is used to etch a wafer, deposit materials on a wafer, clean a wafer, etc. To perform the operations, the plasma-based system includes a radio frequency (RF) generator. The RF generator is coupled to an impedance block that is further coupled to a plasma chamber.

The RF generator generates an RF signal that is transferred via the impedance block to the plasma chamber. When a gas is supplied into the plasma chamber, the gas is ignited with the RF signal and plasma is formed within the plasma chamber.

However, there may be a replacement of the impedance block with another impedance block. For example, an impedance block that is malfunctioning may be replaced with another impedance block. As another example, an impedance block that is nonoperational may be replaced with another impedance block. An impedance block may be replaced for any reason other than that the impedance block is nonoperational or malfunctioning.

It is in this context that embodiments described in the present disclosure arise.

SUMMARY

Embodiments of the disclosure provide apparatus, methods and computer programs for generating segments of a model within a plasma system. It should be appreciated that the present embodiments can be implemented in numerous ways, e.g., a process, an apparatus, a system, a piece of hardware, or a method on a computer-readable medium. Several embodiments are described below.

In various embodiments, a model is formed from a circuit of a plasma system. For example, an impedance matching model is formed based on characteristics of an impedance matching circuit, a cable model is formed based on characteristics of a radio frequency (RF) cable, or an RF transmission model is formed based on characteristics of an RF transmission line. The model is segmented into a number of modules. Each module includes a series circuit and a shunt circuit. When a circuit of the plasma system is to be replaced with another circuit of the plasma system, one or more of the modules is easily replaced with one or more modules.

In various embodiments, a method for segmenting an impedance matching model is described. The method includes receiving the impedance matching model. The impedance matching model represents an impedance matching circuit, which is coupled to an RF generator via an RF cable and to a plasma chamber via an RF transmission line. The method further includes segmenting the impedance matching model into two or more modules of a first set. Each module including a series circuit and a shunt circuit. The shunt circuit is coupled to the series circuit. The shunt circuit is coupled to a ground connection. The series circuit of the first module is coupled to a cable model. The series circuit of the second module is coupled to an RF transmission model. The series circuit of the first module is coupled to the series circuit of the second module. The shunt circuit of the first module coupled to the series circuit of the second module. The shunt circuit of the second module is coupled to the RF transmission model. The method is executed by a processor.

In some embodiments, a method for segmenting an RF transmission model is described. The method includes receiving an RF transmission model, which represents an RF transmission line. The RF transmission line couples a plasma chamber to an impedance matching circuit, which is coupled via an RF cable to an RF generator. The method further includes segmenting the RF transmission model into two or more modules of a first set. Each module includes a series circuit and a shunt circuit. The shunt circuit is coupled to the series circuit. The shunt circuit is coupled to a ground connection and the series circuit of the first module is coupled to an impedance matching model. The series circuit of the first module coupled to the series circuit of the second module and the shunt circuit of the first module is coupled to the series circuit of the second module. The method is executed by a processor.

In a variety of embodiments, a method for segmenting a cable model is described. The method includes receiving a cable model, the cable model representing an RF cable, which couples an RF generator to an impedance matching circuit. The impedance matching circuit is coupled via an RF transmission line to a plasma chamber. The method includes segmenting the cable model into two or more modules of a first set. Each module includes a series circuit and a shunt circuit. The shunt circuit is coupled to the series circuit and to a ground connection. The series circuit of the first module receives a complex voltage and current from a voltage and current probe. The shunt circuit of the second module is coupled to an impedance matching model. The series circuit of the second module is coupled to the impedance matching model. The method is executed by a processor.

In various embodiments, a method for segmenting an impedance matching model is described. The method includes receiving the impedance matching model, which represents an impedance matching circuit. The impedance matching circuit is coupled to an RF generator via an RF cable and to a plasma chamber via an RF transmission line. The method further includes segmenting the impedance matching model into two or more modules of a first set. Each module includes a series circuit and a shunt circuit. The shunt circuit is coupled to the series circuit and to a ground connection. The series circuit of a first one of the modules is coupled to a cable model and the shunt circuit of the first module is coupled to the cable model. The series circuit of the first module is coupled to the series circuit of the second module and the series circuit of the second module coupled to the RF transmission model. The shunt circuit of the second module is coupled to the series circuit of the first module. The method is executed by a processor.

In some embodiments, a method for segmenting an impedance matching model is described. The method includes receiving the impedance matching model, which represents an impedance matching circuit. The impedance matching circuit is coupled to an RF generator via an RF cable and to a plasma chamber via an RF transmission line. The method further includes segmenting the impedance matching model into two or more modules. Each module includes a series function and a shunt function. The shunt function is coupled to the series function and to a ground function. The series function of a first one of the modules is coupled to a cable model and the series function of a second one of the modules coupled to an RF transmission model. Also, the series function of the first module is coupled to the series function of the second module and the shunt function of the first module is coupled to the series function of the second module. The shunt function of the second module is coupled to the RF transmission model. The method is executed by a processor.

In several embodiments, a method for segmenting an impedance matching model is described. The method includes receiving the impedance matching model, which represents an impedance matching circuit. The impedance matching circuit is coupled to an RF generator via an RF cable and to a plasma chamber via an RF transmission line. The method further includes segmenting the impedance matching model into two or more modules of a first set. Each module includes a series function and a shunt function. The shunt function is coupled to the series function and to a ground function. The series function of a first one of the modules is coupled to a cable model and the shunt function of the first module is coupled to the cable model. The series function of the first module is coupled to the series function of the second module and the series function of the second module is coupled to the RF transmission model. The shunt function of the second module is coupled to the series function of the first module. The method is executed by a processor.

In one embodiment, a method for segmenting an impedance matching model, the method is described. The method includes generating, by a computer, the impedance matching model. The impedance matching model represents an impedance matching circuit. The impedance matching circuit is configured to couple to an RF generator via an RF cable and to a plasma chamber via an RF transmission line. The impedance matching model includes a first module for a portion of the impedance matching circuit. The method further includes replacing the first module with one or more other modules when the impedance matching circuit is replaced with another impedance matching circuit. The method is executable by a processor.

In an embodiment, the first module includes a series circuit. In one embodiment, the series circuit includes a combination of a resistor, a capacitor, and an inductor.

In an embodiment, the first module is coupled to a second module. The second module is coupled between the first module and a computer-generated model of the RF cable. The series circuit has a first end that is coupled to the second module. The series circuit has a second end that is coupled to a computer-generated model of the RF transmission line.

In one embodiment, the first module is coupled to a second module. The second module is located between the first module and a computer-generated model of the RF transmission line. The series circuit has a first end that is coupled to a computer-generated model of the RF cable and has a second end that is coupled to the second module.

In an embodiment, the first module includes a shunt circuit having a first end that is coupled to a ground connection. In one embodiment, the shunt circuit includes a combination of a resistor, a capacitor, and an inductor.

In one embodiment, the first module is coupled to a second module. In an embodiment, the second module is coupled between the first module and a computer-generated model of the RF cable. The shunt circuit has a second end that is coupled to the second module and to a computer-generated model of the RF transmission line.

In an embodiment, the first module is coupled to a second module. The second module is coupled between the first module and a computer-generated model of the RF transmission line. The shunt circuit has a second end that is coupled to the second module and to a computer-generated model of the RF cable.

In one embodiment, the first module is a polynomial function defining a series circuit. In an embodiment, the polynomial function includes a combination of a resistance and a reactance.

In one embodiment, the first module is a polynomial function representing a shunt circuit. In an embodiment, the polynomial function includes a combination of a resistance and a reactance.

In one embodiment, the one or more other modules represent a portion of the other impedance matching circuit.

Some advantages of the above-described embodiments include ease in replacement of one module of a model with another module of a model. For example, when an impedance matching circuit is replaced with another impedance matching circuit, one or more modules of an impedance matching model that represents the impedance matching circuit being replaced is easily switched with one or more modules of a replacement impedance matching model that represents the replacement impedance matching circuit. For example, a computer-generated code for the one or more modules of the replacement impedance matching model can be easily replaced with a computer-generated code of the one or more modules of the impedance matching model being replaced. Similarly, as another example, when an RF cable is replaced with another RF cable, one or more modules of a cable model that represents the RF cable being replaced is easily switched with one or more modules of another cable model that represents the replacement RF cable. Also, as another example, when an RF transmission line is replaced with another RF transmission line, one or more modules of an RF transmission model that represents the RF transmission line being replaced are is switched with one or more modules of another RF transmission model that represents the replacement RF transmission line.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 is a diagram of an impedance matching model after conversion of the impedance matching model of FIG. 1, in accordance with several embodiments of the present disclosure.

FIG. 3 is a diagram of a module of the converted impedance matching model, in accordance with various embodiments of the present disclosure.

FIG. 4A is a diagram of the module of FIG. 3 in which inductors and capacitors have fixed values, in accordance with some embodiments of the present disclosure.

FIG. 12A is a graph that illustrates a relationship between a voltage measured at an output of an impedance matching circuit with respect to time and a modeled voltage at a corresponding output of an impedance matching model generated based on the impedance matching circuit with respect to time, in accordance with various embodiments of the present disclosure.

FIG. 12B is an embodiment of a graph that illustrates a relationship between a current measured at an output of an impedance matching circuit with respect to time and a modeled current at a corresponding output of an impedance matching model generated based on the impedance matching circuit with respect to time, in accordance with various embodiments of the present disclosure.

DETAILED DESCRIPTION

The following embodiments describe systems and methods for segmenting a model within a plasma system. It will be apparent that the present embodiments may be practiced without some or all of these specific details. In other instances, well known process operations have not been described in detail in order not to unnecessarily obscure the present embodiments.

Figure 1:
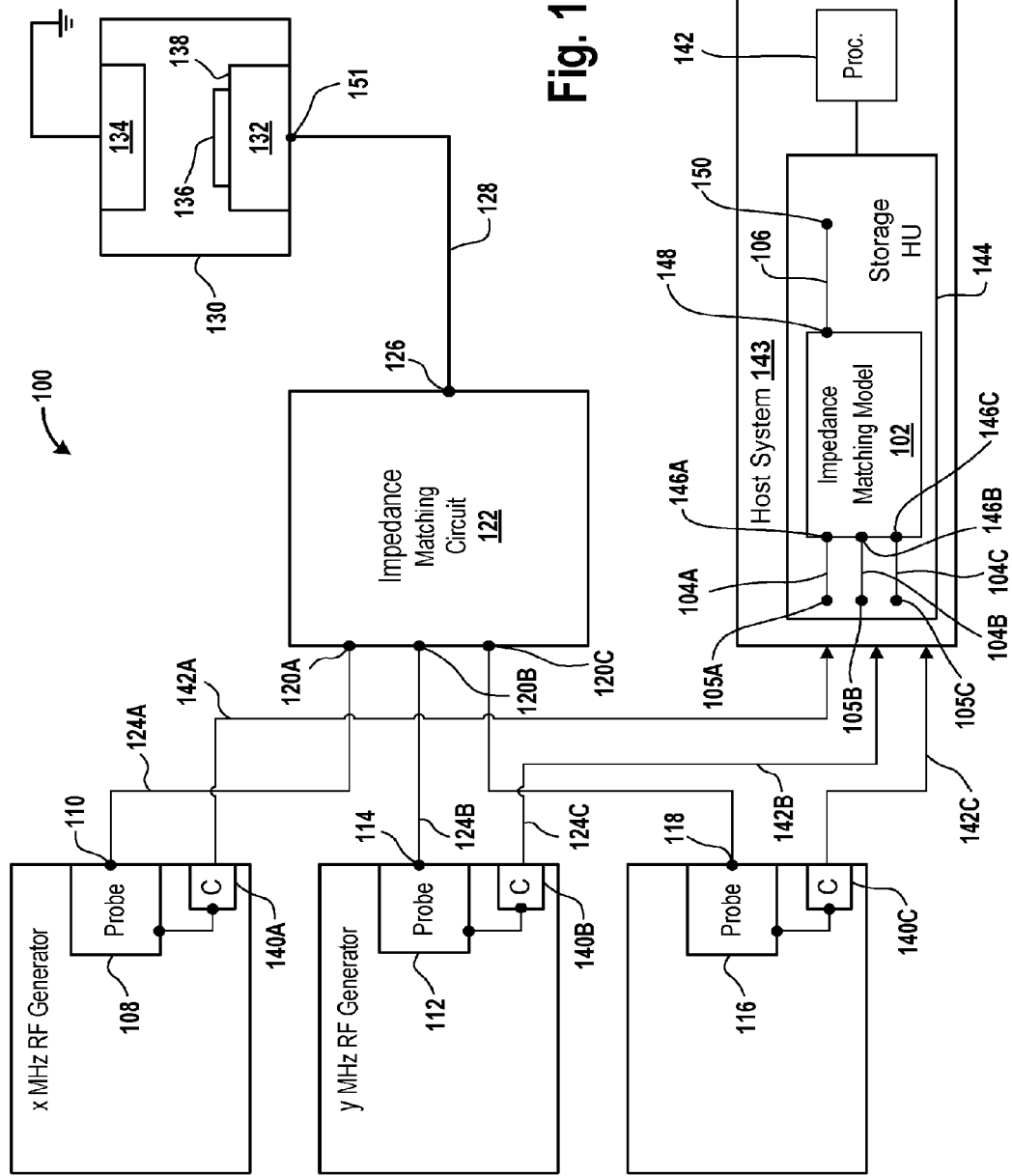
FIG. 1 is a block diagram of a plasma system for segmenting an impedance matching model, a cable model and/or a radio frequency (RF) transmission model, in accordance with some embodiments of the present disclosure.

FIG. 1 is a block diagram of an embodiment of a plasma system 100 for segmenting an impedance matching model 102, a cable model 104A, and/or a radio frequency (RF) transmission model 106. The plasma system 100 includes an x megahertz (MHz) RF generator, a y MHz RF generator, and a z MHz RF generator.

A voltage and current (VI) probe 108 measures a complex voltage and current Vx, Ix, and φx at an output 110, of the x MHz RF generator. It should be noted that Vx represents a voltage magnitude, Ix represents a current magnitude, and φx represents a phase between Vx and Ix. Similarly, a voltage and current probe 112 measures a complex voltage and current Vy, Iy, and φy at an output 114 of the y MHz RF generator. It should be noted that Vy represents a voltage magnitude, Iy represents a current magnitude, and φy represents a phase between Vy and Iy. Moreover, a voltage and current probe 116 measures a complex voltage and current Vz, Iz, and φz at an output 118 of the z MHz RF generator. It should be noted that Vz represents a voltage magnitude, Iz represents a current magnitude, and φz represents a phase between Vz and Iz.

Examples of x MHz include 2 MHz, 27 MHz, and 60 MHz. Examples of y MHz include 2 MHz, 27 MHz, and 60 MHz. Examples of z MHz include 2 MHz, 27 MHz, and 60 MHz. The x MHz is different than y MHz and z MHz. For example, when x MHz is 2 MHz, y MHz is 27 MHz and z MHz is 60 MHz. When x MHz is 27 MHz, y MHz is 60 MHz and z MHz is 2 MHz.

An example of a voltage and current probe includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 108, 112, or 116 is calibrated according to NIST standard. In this illustration, the voltage and current probe 108, 112, or 116 is coupled with an open circuit, a short circuit, or a known load to calibrate the voltage and current probe to comply with the NIST standard. The voltage and current probe 108, 112, or 116 may first be coupled with the open circuit, then with the short circuit, and then with the known load to calibrate the voltage and current probe based on NIST standard. The voltage and current probe 108, 112, or 116 may be coupled to the known load, the open circuit, and the short circuit in any order to calibrate the voltage and current probe according to NIST standard. Examples of a known load include a 50 ohm load, a 100 ohm load, a 200 ohm load, a static load, a direct current (DC) load, a resistor, etc. As an illustration, each voltage and current probe 108, 112, or 116 is calibrated according NIST-traceable standards.

The voltage and current probe 108 is coupled to the output 110 of the x MHz RF generator. The output 110 is coupled to an input 120A of an impedance matching circuit 122 via an RF cable 124A. Similarly, the voltage and current probe 112 is coupled to the output 114 of the y MHz RF generator. The output 114 is coupled to another input 120B of the impedance matching circuit 122 via an RF cable 124B. Also, the voltage and current probe 116 is coupled to the output 118 of the z MHz RF generator. The output 118 is coupled to another input 120C of the impedance matching circuit 122 via an RF cable 124C.

An output 126 of the impedance matching circuit 122 is coupled to an input of an RF transmission line 128. The RF transmission line 128 is coupled to an electrostatic chuck (ESC) 132 located within a plasma chamber 130.

The impedance matching circuit 122 matches an impedance of a source coupled to the impedance matching circuit 122 with an impedance of a load coupled to the impedance matching circuit 122. For example, the impedance matching circuit 122 matches a combined impedance of the x MHz RF generator and the RF cable 124A with a combined impedance of the RF transmission line 128 and the plasma chamber 130. In this example, the x MHz RF generator is on and the y and z MHz RF generators are off.

The plasma chamber 130 includes the ESC 132, an upper electrode 134, and other parts (not shown), e.g., an upper dielectric ring surrounding the upper electrode 134, an upper electrode extension surrounding the upper dielectric ring, a lower dielectric ring surrounding a lower electrode of the ESC 132, a lower electrode extension surrounding the lower dielectric ring, an upper plasma exclusion zone (PEZ) ring, a lower PEZ ring, etc. The upper electrode 134 is located opposite to and facing the ESC 132. A work piece 136, e.g., a semiconductor wafer, a dummy wafer, etc., is supported on an upper surface 138 of the ESC 132. Various processes, e.g., chemical vapor deposition, cleaning, deposition, sputtering, etching, ion implantation, resist stripping, etc., are performed on the semiconductor wafer during production. Integrated circuits, e.g., application specific integrated circuit (ASIC), programmable logic device (PLD), etc. are developed on the semiconductor wafer and the integrated circuits are used in a variety of electronic items, e.g., cell phones, tablets, smart phones, computers, laptops, networking equipment, etc. Each of the lower electrode and the upper electrode 134 is made of a metal, e.g., aluminum, alloy of aluminum, copper, etc.

In one embodiment, the upper electrode 134 includes one or more gas inlets, e.g. holes, etc., that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 134 is grounded. The ESC 132 is coupled to the x, y, and z MHz RF generators via the impedance matching circuit 122.

When the process gas is supplied between the upper electrode 134 and the ESC 132 and when the x MHz RF generator, the y MHz, and/or the z MHz RF generator supplies RF signals via the impedance matching circuit 122 and the RF transmission line 128 to the ESC 132, the process gas is ignited to generate plasma within the plasma chamber 130.

When the x MHz RF generator generates and provides an RF signal via the output 110, the RF cable 124A, the impedance matching circuit 122, and the RF transmission line 128 to the ESC 132, the voltage and current probe 108 measures the complex voltage and current at the output 110. Similarly, when the y MHz generator generates and provides an RF signal via the output 114, the RF cable 124B, and the RF transmission line 128 to the ESC 132, the voltage and current probe 112 measures the complex voltage and current at the output 114. Also, when the z MHz generator generates and provides an RF signal via the output 118, the RF cable 124C, and the RF transmission line 128 to the ESC 132, the voltage and current probe 116 measures the complex voltage and current at the output 118.

The complex voltages and currents measured by the voltage and current probes 108, 112, and 116 are provided via corresponding communication devices 140A, 140B, and 140C from the corresponding voltage and current probes 108, 112, and 116 via a processor 142 of a host system 143 to a storage hardware unit (HU) 144 of the host system 143 for storage. For example, the complex voltage and current measured by the voltage and current probe 108 is provided via the communication device 140A and a cable 142A to the processor 142, the complex voltage and current measured by the voltage and current probe 112 is provided via the communication device 140B and a cable 142B to the processor 142, and the complex voltage and current measured by the voltage and current probe 116 is provided via the communication device 140C and a cable 142C to the processor 142. The processor 142 stores the complex voltages and current received from the communication devices 140A, 140B, and 140C in the storage HU 144. Examples of a communication device include an Ethernet device that converts data into Ethernet packets and converts Ethernet packets into data, an Ethernet for Control Automation Technology (EtherCAT) device, a serial interface device that transfers data in series, a parallel interface device that transfers data in parallel, a Universal Serial Bus (USB) interface device, etc.

Examples of the host system 143 include a computer, e.g., a desktop, a laptop, a tablet, etc. As used herein, the processor 142 may be a central processing unit (CPU), a microprocessor, an application specific integrated circuit (ASIC), a programmable logic device (PLD), etc. Examples of the storage HU 144 include a read-only memory (ROM), a random access memory (RAM), or a combination thereof. The storage HU 144 may be a flash memory, a redundant array of storage disks (RAID), a hard disk, etc.

The impedance matching model 102 is generated by the processor 142 and is stored within the storage HU 144. In some embodiments, the processor 142 receives the impedance matching model 102 from another processor. The impedance matching model 102 represents the impedance matching circuit 122. For example, the impedance matching model 102 has similar characteristics, e.g., capacitances, inductances, resistances, complex power, complex voltage and currents, impedance, a combination thereof, etc., as that of the impedance matching circuit 122. To illustrate, the impedance matching model 102 has the same number of capacitors, resistors, and/or inductors as that within the impedance matching circuit 122, and the capacitors, resistors, and/or inductors are connected with each other in the same manner, e.g., serial, parallel, etc. as that within the impedance matching circuit 122. In this illustration, the impedance matching model 102 has the same capacitance, or resistance, or inductance, or a combination thereof, etc., as a capacitance, or a resistance, or an inductance, or a combination thereof, etc., of the impedance matching circuit 122. To provide an illustration, when the impedance matching circuit 122 includes a capacitor coupled in series with an inductor, the impedance matching model 102 also includes a capacitor coupled in series with an inductor.

To further illustrate, the impedance matching circuit 122 includes one or more electrical components and the impedance matching model 102 includes a design, e.g., a computer-generated model, of the impedance matching circuit 122. The computer-generated model may be generated by the processor 142 based upon input signals received from a user via an input HU. The input signals include signals regarding which electrical components, e.g., capacitors, inductors, etc., to include in a model and a manner, e.g., series, parallel, etc., of coupling the electrical components with each other. To illustrate, the impedance circuit 122 includes hardware electrical components and hardware connections between the electrical components and the impedance matching model 102 includes software representations of the hardware electrical components and of the hardware connections. To provide yet another illustration, the impedance matching model 102 is designed using a software program and the impedance matching circuit 122 is made on a printed circuit board. As used herein, electrical components may include resistors, capacitors, inductors, connections between the resistors, connections between the inductors, connections between the capacitors, and/or connections between a combination of the resistors, inductors, and capacitors.

To provide another illustration, the impedance matching model 102 is represented by a function as that used to represent the impedance matching circuit 122. For example, the impedance matching model 102 is represented by a function, e.g., a mathematical function, etc., of resistances and reactances, and the function represents the impedance matching circuit 122.

The cable models 104A, 104B, 104C, and the RF transmission model 106 are generated by the processor 142 and are stored in the storage HU 144. In some embodiments, the cable models 104A, 104B, 104C, and the RF transmission model 106 are received by the processor 142 from another processor.

The cable model 104A represents the RF cable 124A, the cable model 104B represents the RF cable 124B, and the cable model 104C represents the RF cable 124C. For example, the cable model 104A and the RF cable 124A has similar characteristics, a cable model 104B and the RF cable 124B has similar characteristics, and a cable model 104C and the RF cable 124C has similar characteristics. For example, the cable model 104B has the same number of circuit elements, e.g., resistors, capacitors and/or inductors, etc., as that within the RF cable 124A, and the resistors, capacitors and/or inductors are connected with each other in the same manner, e.g., serial, parallel, etc. as that within the RF cable 124A. As another example, an inductance, a capacitance, or a combination thereof, etc., of the cable model 104A is the same as an inductance, a capacitance, or a combination thereof, etc., of the RF cable 124A. As another example, the cable model 104A is a computer-generated model of RF cable 124A, the cable model 104B is a computer-generated model of the RF cable 124B, and the cable model 104C is a computer-generated model of the RF cable 124C. As yet another example, the cable model 104A is represented by a function, e.g., a mathematical function, etc., of resistances and reactances, and the function represents the RF cable 124A. As another example, the cable model 104B is represented by a function, e.g., a mathematical function, etc., of resistances and reactances, and the function represents the RF cable 124B. As another example, the cable model 104C is represented by a function, e.g., a mathematical function, etc., of resistances and reactances, and the function represents the RF cable 124C. The cable model 104A has an input 105A, the cable model 104B has an input 105B, and the cable model 104C has an input 105C.

The RF transmission model 106 represents the RF transmission line 128. For example, the RF transmission model 106 and the RF transmission line 128 have similar characteristics. As another example, the RF transmission model 106 has the same number of circuit elements, e.g., resistors, capacitors and/or inductors, etc., as that within the RF transmission line 128, and the resistors, capacitors and/or inductors are connected with each other in the same manner, e.g., serial, parallel, etc. as that within the RF transmission line 128. To further illustrate, when the RF transmission line 128 includes a capacitor coupled in parallel with a resistor, the RF transmission model 106 also includes the capacitor coupled in parallel with the resistor. As yet another example, the RF transmission line 128 includes one or more electrical components and the RF transmission model 106 includes a design, e.g., a computer-generated model, of the RF transmission line 128. As another example, the RF transmission model 106 is represented by a function, e.g., a mathematical function, etc., of resistances and reactances, and the function represents the RF transmission line 128. As another example, an impedance, an inductance, a capacitance, or a combination thereof, etc., of the RF transmission model 106 is the same as an impedance, inductance, a capacitance, or a combination thereof, etc., of the RF transmission line 128.

In some embodiments, the RF transmission model 106 is a computer-generated impedance transformation involving computation of characteristics, e.g., capacitances, resistances, inductances, a combination thereof, etc., of elements, e.g., capacitors, inductors, resistors, a combination thereof, etc., and determination of connections, e.g., series, parallel, etc., between the elements.

The processor 142 generates the impedance matching model 102 and converts, e.g., segments, etc., the impedance matching model 102 into one or more modules. Similarly, the processor 142 generates the cable model 104A and converts, segments, etc., the cable model 104A into one or more modules, generates the cable model 104B and converts the cable model 104B into one or more modules, and generates the cable model 104C and segments the cable model 104C into one or more modules. Moreover, the processor 142 generates the RF transmission model 106 and converts, segments, etc., the RF transmission model 106 into one or more modules.

Based on the complex voltage and current received at the input 105A from the voltage and current probe 108 via the cable 142A and characteristics, e.g., impedance, resistance, reactance, complex voltage and current, etc., of the one or more modules of the cable model 104A, the processor 142 calculates a complex voltage and current at an input 146A of the impedance matching model 102. The complex voltage and current at the input 146A is stored in the storage HU 144.

Similarly, based on the complex voltage and current received at the input 105B from the voltage and current probe 112 via the cable 142B and characteristics, e.g., impedance, resistance, reactance, complex voltage and current, etc., of the one or more modules of the cable model 104B, the processor 142 calculates a complex voltage and current at an input 146B of the impedance matching model 102. Also, based on the complex voltage and current received at the input 105C from the voltage and current probe 116 via the cable 142C and characteristics, e.g., impedance, resistance, reactance, complex voltage and current, etc., of the one or more modules of the cable model 104C, the processor 142 calculates a complex voltage and current at an input 146C of the impedance matching model 102.

Moreover, based on the complex voltage and current at the input 146A and characteristics, e.g., impedance, resistance, reactance, complex voltage and current, etc., of the one or more modules of the impedance matching model 102, the processor 142 calculates a complex voltage and current at an output 148 of the impedance matching model 102. A complex voltage and current at the output 148 is stored in the storage HU 144.

Similarly, based on the complex voltage and current at the input 146B and characteristics, e.g., impedance, resistance, reactance, complex voltage and current, etc., of the one or more modules of the impedance matching model 102, the processor 142 calculates a complex voltage and current at the output 148 of the impedance matching model 102. Also, based on the complex voltage and current at the input 146C and characteristics, e.g., impedance, resistance, reactance, complex voltage and current, etc., of the one or more modules of the impedance matching model 102, the processor 142 calculates a complex voltage and current at the output 148 of the impedance matching model 102.

In some embodiments, a voltage magnitude is a root mean square (RMS) voltage and a current magnitude is an RMS current.

The output 148 is coupled to an input of the RF transmission model 106, which is stored in the storage HU 144.

Based on the complex voltage and current at the output 148 and characteristics, e.g., impedance, resistance, reactance, complex voltage and current, etc., of the one or more modules of the RF transmission model 106, the processor 142 calculates a complex voltage and current at an output 150 of the RF transmission model 106. The output 150 is a model of an output 151 of the RF transmission line 128 and the output 151 is coupled to the ESC 132 to provide RF signals generated by one or more of the x, y, and z MHz RF generators to the ESC 132. The complex voltage and current determined at the output 150 is stored in the storage HU 144.

It should be noted that although three generators are shown coupled to the impedance matching circuit 122, in one embodiment, any number of RF generators, e.g., a single generator, two generators, etc., are coupled to the plasma chamber 130 via an impedance matching circuit.

It should further be noted that although the above embodiments are described with respect to using a complex voltage and current, instead of the complex voltage and current, the embodiments may be described using impedances. For example, based on an impedance determined from the complex voltage and current received from the voltage and current probe 108 via the cable 142A and the one or more modules of the cable model 104A, the processor 142 calculates an impedance at the input 146A of the impedance matching model 102. The impedance is determined by the processor 142 from the complex voltage and current received from the voltage and current probe 108. As another example, based on the impedance at the input 146A and the one or more modules of the impedance matching model 102, the processor 142 calculates an impedance at the output 148 of the impedance matching model 102. As yet another example, based on the impedance at the output 148 and the one or more modules of the RF transmission model 106, the processor 142 calculates an impedance at the output 150 of the RF transmission model 106.

FIG. 2 is a diagram of an embodiment of an impedance matching model 103 after conversion, e.g., segmentation, etc. of the impedance matching model 102 (FIG. 1). The processor 142 (FIG. 1) segments the impedance matching model 102 into multiple modules 201, 203, and 205. In some embodiments, the processor 142 segments the impedance matching model 102 into any number of modules, e.g., N modules, where N is an integer greater than zero.

The processor 142 maintains a coupling between elements of the impedance matching model 102 after the segmentation of the impedance matching model 102 into modules 201, 203, and 205. For example, the processor maintains a series connection or a parallel connection between two circuit elements, e.g., a capacitor and an inductor, a resistor and an inductor, a capacitor and a resistor, etc., of the impedance matching model 102 before and after the segmentation.

The modules 201, 203, and 205 of the impedance matching model 103 are coupled with each other. For example, the module 201 is coupled to the module 203 via a link 202 and the module 203 is coupled to the module 205 via a link 204.

The module 201 has an input 206, which is an example of the input 146A, the input 146B, or the input 146C (FIG. 1) of the impedance matching model 102. The module 201 has an output 208, which is coupled to an input 210 of the module 203. The module 203 has an output 212, which is coupled to an input 214 of the module 205. The module 205 has an output 216, which is an example of the output 148 (FIG. 1) of the impedance matching model 102.

To generate an impedance matching model of another impedance matching circuit (not shown), e.g., a circuit that is other than and that replaces the impedance matching circuit 122 (FIG. 1), the processor 142 replaces the module 201 with another module (not shown), replaces the module 203 with another module (not shown), and/or replaces the module 205 with another module (not shown). The processor 142 establishes a series link between the replacement modules and unreplaced modules, e.g., the module 201, 203, or 205, etc., when all of the modules 201, 203 and 205 are not replaced or establishes a series link between the replacement modules when all of the modules 201, 203 and 205 are replaced by the replacement modules.

A series combination of the replacement modules (not shown) that replaces the corresponding modules 201, 203, and/or 205 has similar characteristics as that of the other impedance matching circuit (not shown). For example, a combined impedance of the replacement modules (not shown) is the same as or within a range of an impedance of the other impedance matching circuit (not shown). In this example, the replacement modules (not shown) represent the other impedance matching circuit (not shown). As another example, a combined impedance of one of the replacement modules (not shown), the module 203, and the module 205 is the same as or within a range of an impedance of the other impedance matching circuit (not shown). In this example, the one of the replacement modules (not shown), the module 203, and the module 205 represent the other impedance matching circuit (not shown). Modularity of impedance matching models allows easy replacement of one or more modules of one of the impedance matching models with one or more modules of another one of the impedance matching models.

Upon replacing the module 201 with another module (not shown), replacing the module 203 with another module (not shown), and/or replacing the module 205 with another module, the processor 142 checks whether characteristics, e.g., impedance, complex voltage and current, etc., of an impedance matching model that includes one or more of the replacement modules (not shown) and/or one or more of the modules 201, 203, and 205 are similar to characteristics, e.g., impedance, complex voltage and current, etc., of the other impedance matching circuit (not shown). For example, the processor 142 calculates a combined impedance of the replacement modules (not shown) and/or one or more of the modules 201, 203, and 205 and compares the combined impedance with an impedance of the other replacement impedance matching circuit (not shown). Upon determining that the combined impedance of the replacement modules (not shown) and/or one or more of the modules 201, 203, and 205 matches with or is within a range of the impedance of the other replacement impedance matching circuit (not shown), the processor 142 determines that characteristics of the impedance matching model that includes one or more of the replacement modules (not shown) and/or one or more of the modules 201, 203, and 205 are similar to characteristics of the other impedance matching circuit (not shown). On the other hand, upon determining that the combined impedance of the replacement modules (not shown) and/or one or more of the modules 201, 203, and 205 do not match with or is not within a range of the impedance of the other replacement impedance matching circuit (not shown), the processor 142 determines that characteristics of the impedance matching model that includes one or more of the replacement modules (not shown) and/or one or more of the modules 201, 203, and 205 are not similar to characteristics of the other impedance matching circuit (not shown).

In various embodiments, the impedance of the other replacement impedance matching circuit is received by the processor 142 from another processor. In some embodiments, the impedance of the other replacement impedance matching circuit is calculated by the processor 142 based on complex voltages and currents measured at an input and at an output of the other replacement impedance matching circuit.

FIG. 3 is a diagram of an embodiment of a module n of the impedance matching model 103, where n ranges from 1 thru N. The module n includes a series circuit 218 and a shunt circuit 220. In some embodiments, the module n includes only one series circuit 218 and only one shunt circuit 220. The shunt circuit 220 is coupled to a ground connection 222. Also, the parallel shunt circuit 220 is coupled to the series circuit 218.

The module n has an input 224, which is an example of the input 206, the input 210, or the input 214 (FIG. 2). Moreover, the module n has an output 226, which is an example of the output 208, the output 212, or the output 216 (FIG. 2).

As shown, the series circuit 218 is coupled to the input 224 and to the output 226. Moreover, the shunt circuit 220 is coupled to the output 226.

In some embodiments, a quadratic function is used instead of the series circuit 218 and a quadratic function is used instead of the shunt circuit 220. The quadratic function that is used instead of the series circuit 218 represents a directional sum of resistances of all elements of the series circuit 218 and a directional sum of reactances of the elements of the series circuit. For example, the series circuit is represented as $R_s+jX_s$, where $R_s$ is a result of a directional sum of resistances of all elements of the series circuit 218, $X_s$ is a result of a directional sum of reactances of all elements of the series circuit 218, and j is the imaginary unit. Moreover, the quadratic function that is used instead of the shunt circuit 220 represents a directional sum of resistances of all elements of the shunt circuit 220 and a directional sum of reactances of all elements of the shunt circuit 220. For example, the shunt circuit is represented as $R_p+jX_p$, where $R_p$ is a result of a directional sum of resistances of all elements of the shunt circuit 220, and $X_p$ is a result of a directional sum of reactances of all elements of the shunt circuit 220.

In various embodiments, the series circuit 218 or the shunt circuit 220 includes a resistor coupled in series with an inductor and a capacitor. In some embodiments, the series circuit 218 or the shunt circuit 220 includes a resistor coupled in series with an inductor or in series with a capacitor. In several embodiments, the series circuit 218 or the shunt circuit 220 includes an inductor coupled in series with a capacitor. In several embodiments, the series circuit 218 or the shunt circuit 220 includes an inductor, a resistor, or a capacitor.

In some embodiments, the processor 142 (FIG. 1) determines an impedance $Z_{(n+1)\text{-}in}$ at an input of an $(n+1)^{th}$ module of the impedance matching model 103 (FIG. 2) based on an impedance $Z_{n\text{-}in}$ at an input of the $n^{th}$ module of the impedance matching model 103 and characteristics, e.g., parameters, etc., of the $n^{th}$ module. For example, the processor 142 determines the impedance $Z_{(n+1)\text{-}in}$ according to a function:

$$Z_{(n+1)-in} = \frac{Z_{np}(Z_{n-in} - Z_{ns})}{Z_{np} - (Z_{n-in} - Z_{ns})} \quad (1)$$

where $Z_{np}$ is an impedance of the shunt circuit 220 and $Z_{ns}$ is an impedance of the series circuit 218, and where $Z_{np}$ and $Z_{ns}$ are parameters of the $n^{th}$ module. The $(n+1)^{th}$ module follows and is consecutive to the $n^{th}$ module. For example, when the module 201 (FIG. 2) is the $n^{th}$ module, the module 203 (FIG. 2) is the $(n+1)^{th}$ module.

In several embodiments, when the $n^{th}$ module is a first module of the impedance matching model 103, the processor 142 determines the impedance $Z_{n-in}$ at an input of the $n^{th}$ module based on an impedance at the output 110 (FIG. 1) of the x MHz RF generator and characteristics of the cable model 104A (FIG. 1). For example, the processor 142 calculates an impedance of the cable model 104A based on elements of the cable model 104A and generates a directional sum of impedance generated from complex voltage and current measured at the output 110 and the impedance of the cable model 104A.

In some embodiments, an impedance at an output of an RF generator is a load impedance as seen by the generator. For example, an impedance at the output 110 of the x MHz RF generator is a load impedance as seen by the x MHz RF generator.

In various embodiments, the processor 142 (FIG. 1) determines a power $P_{loss-n}$, which is power lost in the $n^{th}$ module based on a power $P_{n-in}$, which is power input to the $n^{th}$ module and parameters of the $n^{th}$ module. For example, the processor 142 determines the power loss $P_{loss-n}$ according to a function:

$$P_{loss-n} = P_{n-in}\left[\frac{Re(Z_{ns})}{Re(Z_{n-in})} + \left\{\frac{Re(Z_{np})}{Re(Z_{n-in})}\left|\frac{Z_{n-in} - Z_{ns}}{Z_{np}}\right|^2\right\}\right] \quad (2)$$

where $Re(Z_{ns})$ is a resistance of the impedance $Z_{ns}$, $Re(Z_{n-in})$ is a resistance of the impedance $Z_{n-in}$, and $Re(Z_{np})$ is a resistance of the impedance $Z_{np}$, and "| |" represents a magnitude of impedance. In various embodiments, the processor 142 subtracts the power loss $P_{loss-n}$ from the input power $P_{n-in}$ to determine power $P_{(n+1)-in}$ that is input to the consecutive $(n+1)^{th}$ module.

In some embodiments, the power $P_{n-in}$ input to the $n^{th}$ module is determined based on the complex voltage and current measured at the output 110 (FIG. 1) and impedance of the cable model 104A, 104B, or 104C (FIG. 1) that is coupled to the $n^{th}$ module.

When there are N modules in the impedance matching model 103, the processor 142 determines a current $I_{n-out}$, e.g., root mean square current, current magnitude, etc., at an output of the $n^{th}$ module based on the power $P_{n-in}$ and the impedance $Z_{n-in}$ of the $n^{th}$ module. For example, the processor 142 determines the current $I_{n-out}$ as a square root of a ratio of the power $P_{n-in}$ and a resistance of the impedance $Z_{n-in}$. Moreover, when there are N modules in the impedance matching model 103, the processor 142 determines a voltage $V_{n-out}$, e.g., root mean square voltage, voltage magnitude, etc., at an output of the $n^{th}$ module based on the current $I_{n-out}$ and the impedance $Z_{n-in}$. For example, the processor 142 calculates the voltage $V_{n-out}$ as a product of the current $I_{n-out}$ and a magnitude of the impedance $Z_{n-in}$.

FIG. 4A is a diagram of an embodiment of a module 230, which is an example of the module n (FIG. 3). The module 230 includes a series resistor-inductor-capacitor (RLC) circuit 232 and a shunt RLC circuit 234. The series RLC circuit 232 is an example of the series circuit 218 and the shunt RLC circuit 234 is an example of the shunt circuit 220.

The series RLC circuit 232 includes a resistor $R_{fs}$, an inductor $L_{fs}$, and a capacitor $C_{fs}$. The resistor $R_{fs}$ is coupled in series with the inductor $L_{fs}$, and the inductor $L_{fs}$ is coupled in series with the capacitor $C_{fs}$. The parallel RLC circuit 234 includes a resistor $R_{fp}$, an inductor $L_{fp}$, and a capacitor $C_{fp}$. The resistor $R_{fp}$ is coupled in series with the inductor $L_{fp}$, and the inductor $L_{fp}$ is coupled in series with the capacitor $C_{fp}$. The capacitor $C_{fp}$ is coupled to a ground connection 236.

Inductances of the inductor $L_{fs}$ and $L_{fp}$ are fixed, e.g., constant. Similarly, capacitances of the capacitors $C_{fs}$ and $C_{fp}$ are fixed. Also, resistances of the resistors $R_{fs}$ and $R_{fp}$ are fixed.

Figure 4C:
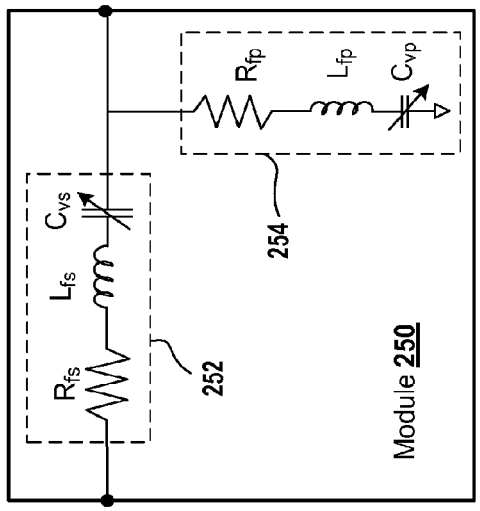
FIG. 4C is a diagram of the module of FIG. 3 in which capacitors have variable values, in accordance with various embodiments of the present disclosure.
Figure 4B:
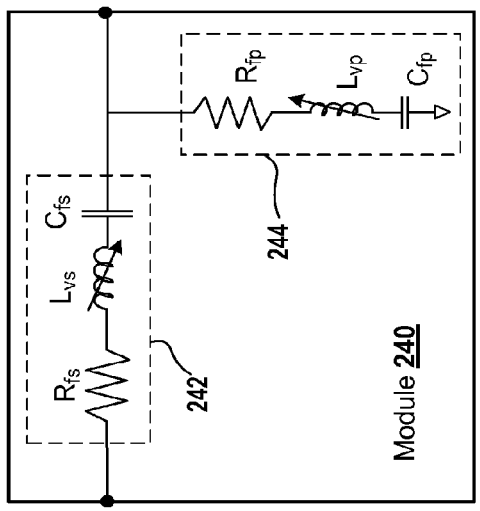
FIG. 4B is a diagram of the module of FIG. 3 in which inductors have variable values, in accordance with several embodiments of the present disclosure.

FIG. 4B is a diagram of an embodiment of a module 240 in which inductances of inductors $L_{vs}$ and $L_{vp}$ are variable, e.g. not fixed. The module 240 is an example of the module n (FIG. 3). The module 240 includes a series resistor-inductor-capacitor (RLC) circuit 242 and a parallel RLC circuit 244. The series RLC circuit 242 is an example of the series circuit 218 and the parallel RLC circuit 244 is an example of the shunt circuit 220 (FIG. 3). The series RLC circuit 242 includes the resistor $R_{fs}$, the variable inductor $L_{vs}$, and the capacitor $C_{fs}$. The parallel RLC circuit 244 includes the resistor $R_{fp}$, the variable inductor $L_{vp}$, and the capacitor $C_{fp}$. The module 240 is the same as the module 230 (FIG. 4A) except that in the module 240, the fixed inductor $L_{fs}$ is replaced with the variable inductor $L_{vs}$ and the fixed inductor $L_{fp}$ is replaced with the variable inductor $L_{vp}$.

FIG. 4C is a diagram of an embodiment of a module 250 in which capacitances of capacitors $C_{vs}$ and $C_{vp}$ are variable. The module 250 is an example of the module n (FIG. 3). The module 250 includes a series resistor-inductor-capacitor (RLC) circuit 252 and a parallel RLC circuit 254. The series RLC circuit 252 is an example of the series circuit 218 and the parallel RLC circuit 254 is an example of the shunt circuit 220 (FIG. 3). The series RLC circuit 252 includes the resistor $R_{fs}$, the fixed inductor $L_{fs}$, and the variable capacitor $C_{vs}$. The parallel RLC circuit 254 includes the resistor $R_{fp}$, the fixed inductor $L_{fp}$, and the variable capacitor $C_{vp}$. The module 250 is the same as the module 230 (FIG. 4A) except that in the module 250, the fixed capacitor $C_{fs}$ is replaced with the variable capacitor $C_{vs}$ and the fixed capacitor $C_{fp}$ is replaced with the variable capacitor $C_{vp}$.

Figure 4E:
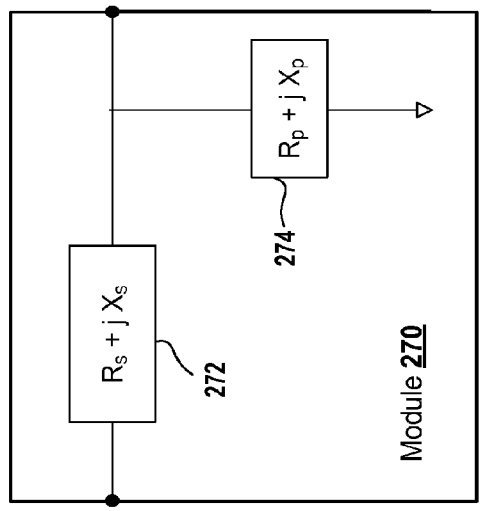
FIG. 4E is a diagram of a module that includes a functional representation of a series circuit of the module of FIG. 3 and a functional representation of a shunt circuit of the module of FIG. 3, in accordance with various embodiments of the present disclosure.
Figure 4D:
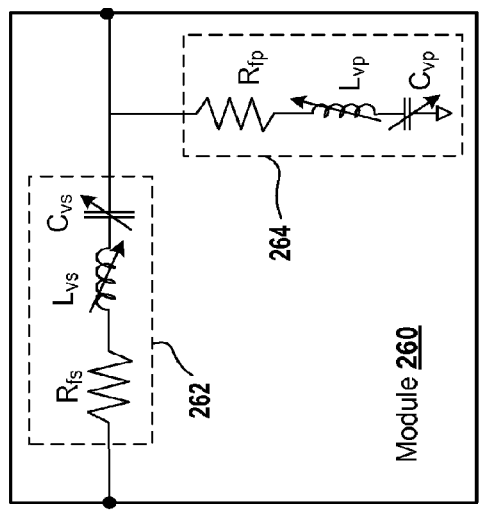
FIG. 4D is a diagram of the module of FIG. 3 in which inductors and capacitors have variable values, in accordance with some embodiments of the present disclosure.

FIG. 4D is a diagram of an embodiment of a module 260 in which capacitances of capacitors $C_{vs}$ and $C_{vp}$ are variable and inductances of the inductors $L_{vs}$ and $L_{vp}$ are variable. The module 260 is an example of the module n (FIG. 3). The module 260 includes a series resistor-inductor-capacitor (RLC) circuit 262 and a parallel RLC circuit 264. For example, the series RLC circuit 262 is an example of the series circuit 218 and the parallel RLC circuit 264 is an example of the shunt circuit 220. The series RLC circuit 262 includes the resistor $R_{fs}$, the variable inductor $L_{vs}$, and the variable capacitor $C_{vs}$. The parallel RLC circuit 264 includes the resistor $R_{fp}$, the variable inductor $L_{vp}$, and the variable capacitor $C_{vp}$. The module 260 is the same as the module 230 (FIG. 4A) except that in the module 260, the fixed capacitor $C_{fs}$ is replaced with the variable capacitor $C_{vs}$, the fixed capacitor $C_{fp}$ is replaced with the variable capacitor $C_{vp}$, the fixed inductor $L_{fs}$ is replaced with the variable inductor $L_{vs}$, and the fixed inductor $L_{fp}$ is replaced with the variable inductor $L_{vp}$.

In some embodiments, a value of resistance of the resistor $R_{fs}$ is zero and/or a value of resistance of the resistor $R_{fp}$ is zero. In various embodiments, a value of inductance of the inductor $L_{fs}$ is zero, a value of inductance of the inductor $L_{vs}$ is zero, a value of inductance of the inductor $L_{fp}$ is zero, and/or a value of inductance of the inductor $L_{vp}$ is zero. In some embodiments, a value of capacitance of the capacitor $C_{fs}$ is zero, a value of capacitance of the capacitor $C_{vs}$ is zero, a value of capacitance of the capacitor $C_{fp}$ is zero, and/or a value of capacitance of the capacitor $C_{vp}$ is zero.

FIG. 4E is a diagram of an embodiment of a module 270 that represents a function 272 that is implemented within the series circuit 218 (FIG. 3) and a function 274 that is implemented within the shunt circuit 220 (FIG. 3). The function 272 is a mathematical function $R_s+jX_s$ and the function 274 is a mathematical function $R_p+jX_p$. The function 274 is a shunt function that shunts a current output by the function 272.

The processor 142 (FIG. 1) calculates the resistance $R_s$ based on a center frequency, e.g., theoretical frequency, etc., of the x MHz RF generator, based on an actual, e.g., measured, etc., frequency of the x MHz RF generator, and based on one or more coefficients. For example, the processor 142 calculates the resistance $R_s$ as a function:

$$R_S = A_{S0} + A_{S1}(F-F_0) + A_{S2}(F-F_0)^2 \qquad (3)$$

where $A_{s0}$, $A_{s1}$, and $A_{s2}$ are coefficients, $F_0$ is a center frequency of the x MHz RF generator and F is an actual frequency of the x MHz RF generator. In some embodiments, the processor 142 determines the center frequency $F_0$ as a frequency of a complex voltage and current measured at the output 110 (FIG. 1). The processor 142 uses the coefficients $A_{s0}$, $A_{s1}$, and $A_{s2}$ that may be determined by experimentation. For example, another processor (not shown) may determine the coefficients $A_{s0}$, $A_{s1}$, and $A_{s2}$ by, e.g., determining the actual frequency of the x MHz RF generator for a number of times complex voltages and currents measured at the output 110 (FIG. 1) are received from the voltage and current probe 108, determining resistances at a point within the impedance matching circuit 122 (FIG. 1) corresponding to an output of the function 272 of the $n^{th}$ module for the number of times, and solving the function (3) for a fit, e.g., best fit, linear fit, etc., for the coefficients $A_{s0}$, $A_{s1}$, and $A_{s2}$. The processor 142 receives the coefficients $A_{s0}$, $A_{s1}$, and $A_{s2}$ from the other processor (not shown).

The processor 142 calculates the reactance $X_s$ based on the center frequency of the x MHz RF generator, based on the actual frequency of the x MHz RF generator, and based on one or more coefficients. For example, the processor 142 calculates the reactance $X_s$ as a function:

$$X_S = B_{S0} + B_{S1}(F-F_0) + B_{S2}(F-F_0)^2 \qquad (4)$$

where $B_{s0}$, $B_{s1}$, and $B_{s2}$ are coefficients. The processor 142 uses the coefficients $B_{s0}$, $B_{s1}$, and $B_{s2}$ that may be determined by experimentation. For example, another processor (not shown) may determine the coefficients $B_{s0}$, $B_{s1}$, and $B_{s2}$ by e.g., determining the actual frequency of the x MHz RF generator for a number of times complex voltages and currents measured at the output 110 (FIG. 1) are received from the voltage and current probe 108, determining reactances at a point within the impedance matching circuit 122 (FIG. 1) corresponding to an output of the function 272 of the $n^{th}$ module for the number of times, and solving the function (4) for a fit, e.g., best fit, linear fit, etc., for the coefficients $B_{s0}$, $B_{s1}$, and $B_{s2}$. The processor 142 receives the coefficients $B_{s0}$, $B_{s1}$, and $B_{s2}$ from the other processor (not shown).

The processor 142 calculates the resistance $R_p$ based on the center frequency of the x MHz RF generator, based on the actual frequency of the x MHz RF generator, and based on one or more coefficients. For example, the processor 142 calculates the resistance $R_p$ as a function:

$$R_P = A_{p0} + A_{p1}(F-F_0) + A_{p2}(F-F_0)^2 \qquad (5)$$

where $A_{p0}$, $A_{p1}$, and $A_{p2}$ are coefficients. The processor 142 receives the coefficients $A_{p0}$, $A_{p1}$, and $A_{p2}$ from another processor (not shown) that determines the coefficients $A_{p0}$, $A_{p1}$, and $A_{p2}$ in a similar manner as that described above.

The processor 142 calculates the reactance $X_p$ based on the center frequency of the x MHz RF generator, based on the actual frequency of the x MHz RF generator, and based on one or more coefficients. For example, the processor 142 calculates the reactance $X_p$ as a function:

$$X_P = B_{p0} + B_{p1}(F-F_0) + B_{p2}(F-F_0)^2 \qquad (6)$$

where $B_{p0}$, $B_{p1}$, and $B_{p2}$ are coefficients. The processor 142 receives the coefficients $B_{p0}$, $B_{p1}$, and $B_{p2}$ from another processor (not shown) that determines the coefficients $B_{p0}$, $B_{p1}$, and $B_{p2}$ in a similar manner as that described above.

In some embodiments, the processor 142 determines impedances, e.g., resistances, reactances, etc., at a point within the impedance matching circuit 122 (FIG. 1) corresponding to the output of the function 272 or to the output of the function 274 of the $n^{th}$ module based on a complex voltage and current measured by a voltage and current probe (not shown) at the point. In various embodiments, the point within the impedance matching circuit 122 (FIG. 1) corresponds to the output of the function 272 or to the output of the function 274 of the $n^{th}$ module when an impedance between an input of the impedance matching circuit 122 and the point within the impedance matching circuit 122 is the same as or within a range of an impedance between an input of the impedance matching module 102 and the point within the impedance matching module 102 and when an impedance between an output of the impedance matching circuit 122 and the point within the impedance matching circuit 122 is the same as or within a range of an impedance between an output of the impedance matching module 102 and the point within the impedance matching module 102.

In some embodiments, an impedance of a circuit element of a model is equal to a resistance of the circuit element when a reactance of the circuit element is zero. In various embodiments, an impedance of a circuit element of a model is equal to a reactance of the circuit element when a resistance of the circuit element is zero.

In the embodiments described with reference to FIG. 4E, the ground connection 222 (FIG. 3) is referred to as a ground function.

Figure 5A:
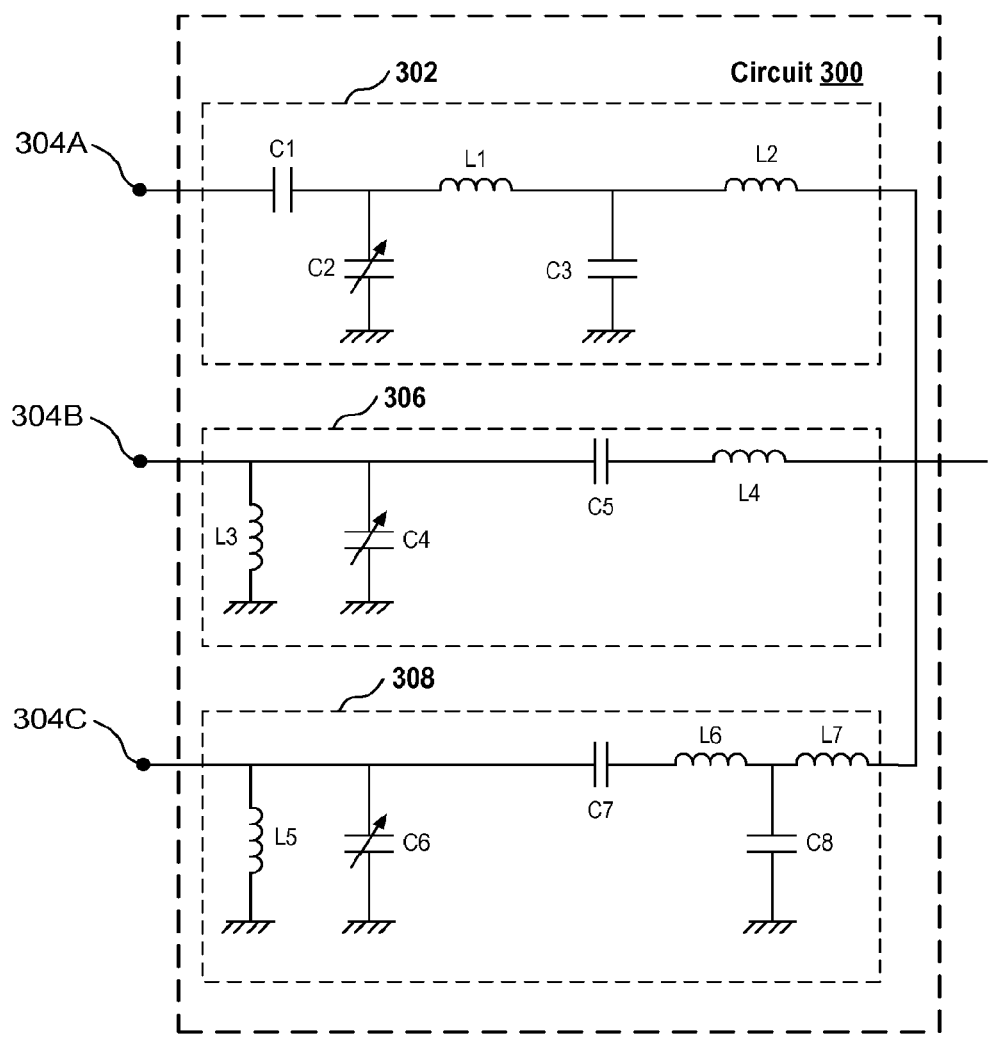
FIG. 5A is a diagram of a circuit of the impedance matching model of FIG. 1, in accordance with various embodiments of the present disclosure.

FIG. 5A is a diagram of a circuit 300, which is an example of the impedance matching model 102 (FIG. 2). The circuit 300 is divided by the processor 142 (FIG. 1) into an x MHz matching model 302, a y MHz matching model 306, and a z MHz matching model 308. The x MHz matching model 302 includes elements, e.g., a capacitor C1, a capacitor C2, an inductor L1, a capacitor C3, and an inductor L2, etc., coupled to an input 304A, which is an example of the input 146A (FIG. 1). The y MHz matching model 306, which includes elements, e.g., an inductor L3, a capacitor C4, a capacitor C5, and an inductor L4, etc., coupled to an input 304B, which is an example of the input 146B (FIG. 1). Moreover, the z MHz matching model 308, which includes elements, e.g., an inductor L5, a capacitor C6, a capacitor C7, and an inductor L6, an inductor L7, a capacitor C8, etc., coupled to an input 304C, which is an example of the input 146C (FIG. 1).

In some embodiments, the x MHz model 302 receives a complex voltage and current from the probe 108 (FIG. 1) of an RF signal that has a frequency, e.g., an operating frequency of the x MHz RF generator, etc., ranging between 1.8 and 2.17 MHz of the x MHz RF generator. In various embodiments, the y MHz model 306 receives a complex voltage and current from the probe 112 (FIG. 1) of an RF signal that has a frequency, e.g., an operating frequency of the y MHz RF generator, etc., ranging between 25.7 and 28.5 MHz of the y MHz RF generator. In some embodiments, the z MHz model 308 receives a complex voltage and current from the probe 116 (FIG. 1) of an RF signal that has a frequency, e.g., an operating frequency of the z MHz RF generator, etc., ranging between 57 and 60 MHz of the z MHz RF generator.

In several embodiments, the x MHz matching model 302 includes any number of inductors, any number of capacitors, and/or any number of resistors. In some embodiments, the y MHz matching model 306 includes any number of inductors, any number of capacitors, and/or any number of resistors. In several embodiments, the z MHz matching model 308 includes any number of inductors, any number of capacitors, and/or any number of resistors. For example, the circuit 300 may be changed to include resistive losses in one or more of the capacitors C1, C2, C3, C4, C5, C6, C7, and C8. As another example, the circuit 300 may be changed to include resistive losses in one or more of the inductors L1, L2, L3, L4, L5, L6, and L7. As yet another example, the circuit 300 may be changed to include variable inductance of one or more of the capacitors C1, C2, C3, C4, C5, C6, C7, and C8. As another example, the circuit 300 may be changed to include variable capacitance of one or more of the inductors L1, L2, L3, L4, L5, L6, and L7. As another example, the circuit 300 may be changed to include a stray capacitance to a ground connection. As yet another example, the circuit 300 may be changed to include a capacitance and/or an inductance of an RF strap of the RF transmission line 128. As another example, the circuit 300 may be changed to consider finite length of one or more of the inductors L1, L2, L3, L4, L5, L6, and L7 and the finite length is not negligible compared to a wavelength of an RF signal that transfers through the inductor.

Figure 5B:
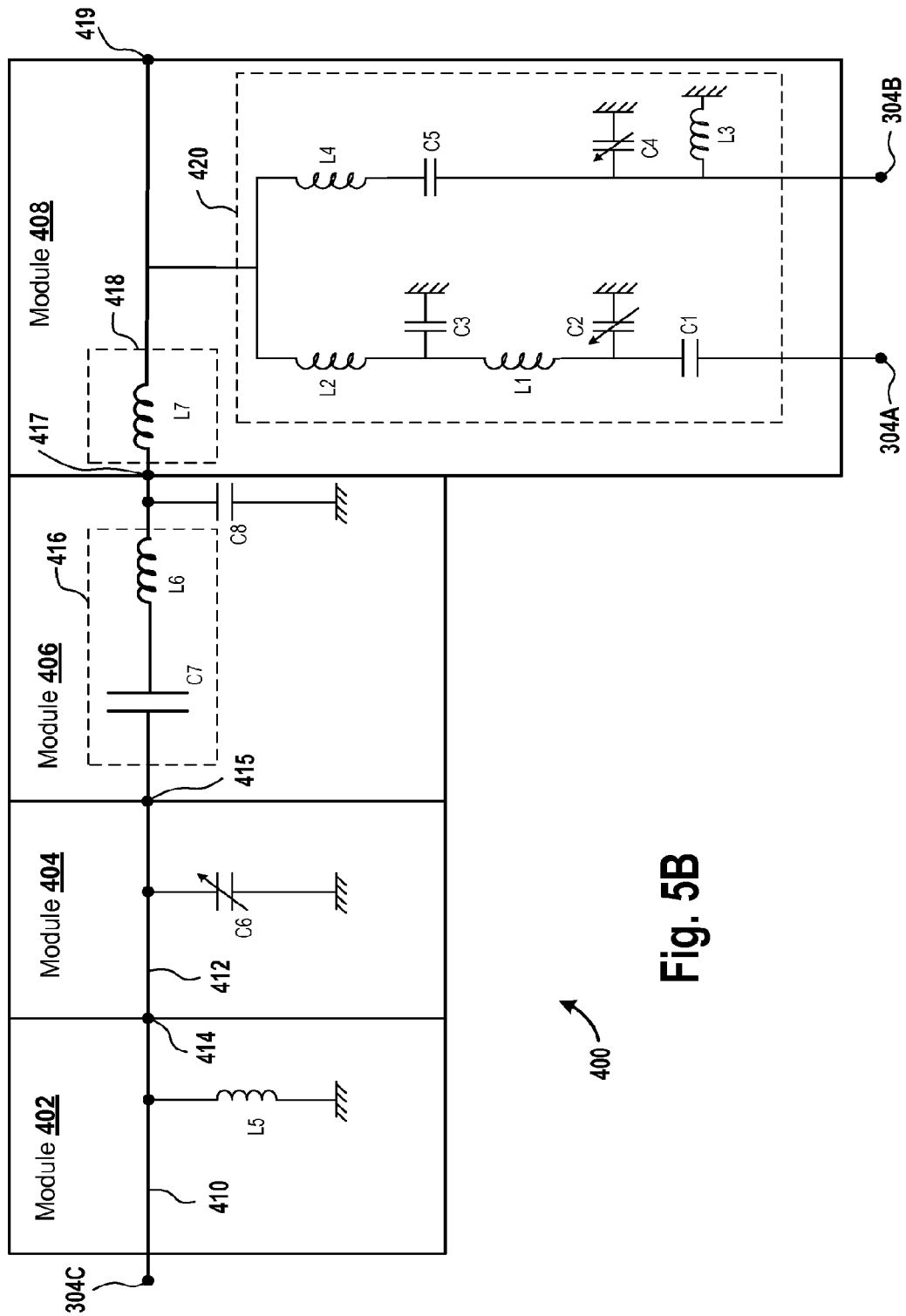
FIG. 5B is a diagram of a segmented circuit generated from the circuit of FIG. 5A, in accordance with some embodiments of the present disclosure.

FIG. 5B is a diagram of an embodiment of a segmented circuit 400, which is an example of the impedance matching model 103 (FIG. 2). The processor 142 segments the circuit 300 into modules 402, 404, 406, and 408 to generate the segmented circuit 400. For example, the processor 142 segments the z MHz impedance model 308 (FIG. 5A) into the module 402, the module 404, the module 406, and allocates the inductor L7 to the module 408. Moreover, the processor 142 combines the x MHz impedance model 302, the y MHz impedance model 306, and the inductor L7 into the module 408.

The module 402 includes the inductor L5, which is a shunt circuit that acts a shunt to a series circuit 410. Moreover, the module 404 includes the capacitor C6. The series circuit 410 and the inductor L5 are coupled to an output 414 of the module 402. The series circuit 412 and the capacitor C6 are coupled to an output 415 of the module 404. The series circuit 412 is also coupled to the output 414 of the module 402.

The module 406 includes a series circuit 416 that includes the capacitor C7 and the inductor L6. The inductor L6 is coupled in series to the capacitor C7. Moreover, the module 406 includes the capacitor C8. The series circuit 416 and the capacitor C8 are coupled to an output 417 of the module 406. The series circuit 416 is also coupled to the output 415 of the module 404.

Also, the module 408 includes a series circuit 418 that includes the inductor L7. The module 408 includes a shunt circuit 420 that includes the inductors L1, L2, L3, L4, and the capacitors C1, C2, C3, C4, and C5. The circuit 420 acts as shunt to the series circuit 418. The series circuit 418 is coupled to the output 417 of the module 406. Also, the series circuit 418 and the shunt circuit 420 are coupled to an output 419, which is an example of the output 216 (FIG. 2). The shunt circuit 420 is coupled to the inputs 304A and 304B.

Figure 5C:
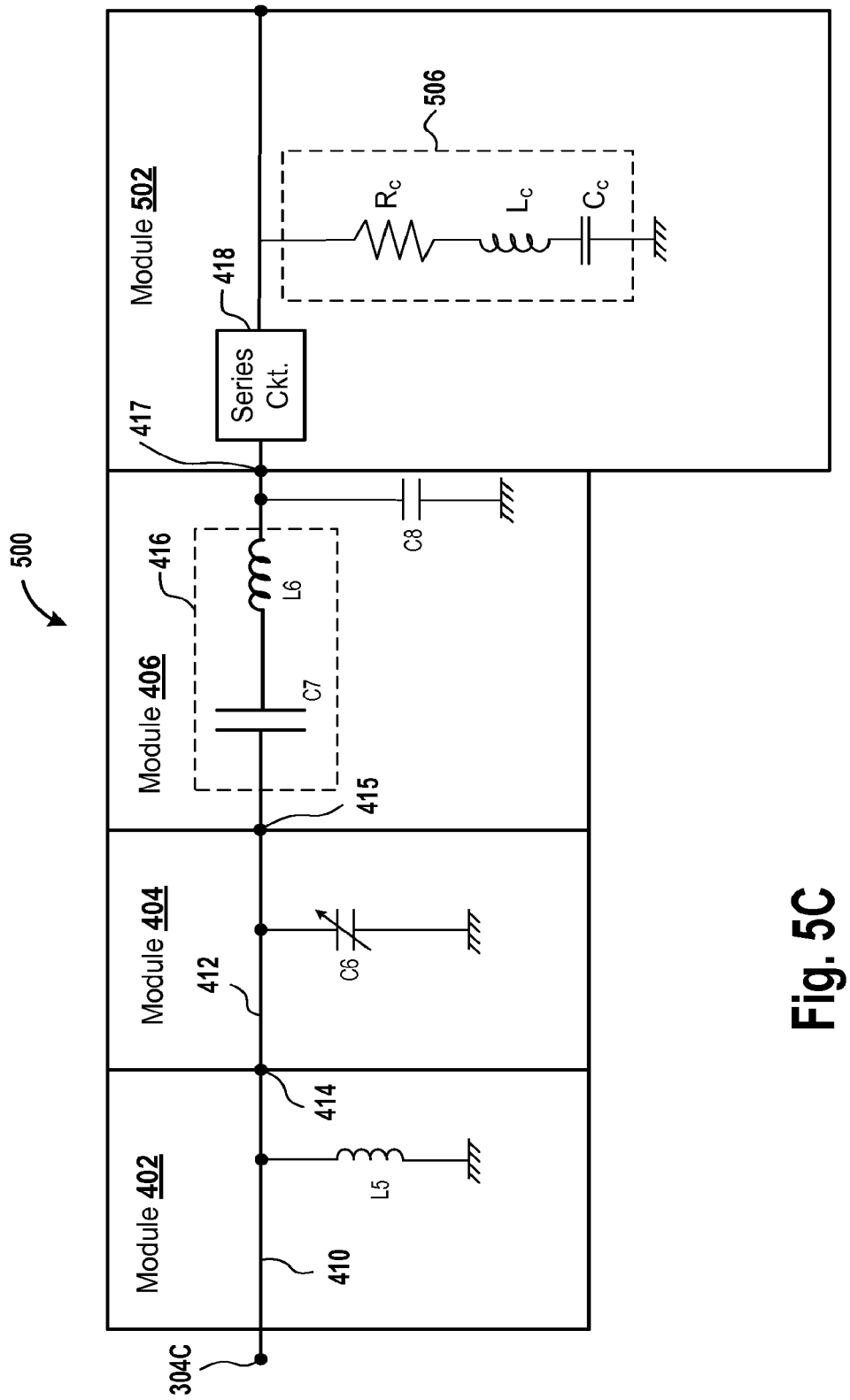
FIG. 5C is a diagram of a segmented circuit that is generated from the segmented circuit of FIG. 5B, in accordance with several embodiments of the present disclosure.

FIG. 5C is a diagram of an embodiment of a segmented circuit 500 that is generated from the segmented circuit 400 (FIG. 5B). The segmented circuit 500 is an example of the impedance matching model 103 (FIG. 2). The segmented circuit 500 includes the modules 402, 404, and 406, and includes a module 502. The module 502 includes the series circuit 418 and a shunt circuit 506. The shunt circuit 506 includes a resistor $R_C$ and an inductor $L_c$ in series with a capacitor $C_c$. The processor 142 determines a combined impedance of the L1, L2, L3 and L4 and the capacitors C1, C2, C3, C4, and C5 and the inputs 304A and 304B and the combined impedance is represented by the processor 142 as a combination of the resistor $R_C$, the inductor Lc, and the capacitor $C_C$.

In some embodiments, a combined capacitance of two capacitors in parallel with each other having positively charged plates coupled to an input wire and negatively charged plates coupled to an output wire is a sum of capacitances of the two capacitors. In various embodiments, a combined capacitance of two capacitors in series with each other having a positively charged plate of a first one of the two capacitors coupled to a negatively charged plate of a second one of the two capacitors is equal to a ratio of a product of capacitances of the two capacitors to a sum of the two capacitances.

In various embodiments, a combined inductance of two inductors in series with each other having a positively charged terminal of a first one of the two inductors coupled to a negatively charged terminal of a second one of the two inductors is equal to a sum of inductances of the two inductors. In various embodiments, a combined inductance of two inductors in parallel with each other having a positively charged terminal of a first one of the two inductors coupled to a negatively charged terminal of a second one of the two inductors is equal to a ratio of product of inductances of the two inductors to a sum of the inductances of the two inductors.

In several embodiments, a combined resistance of two resistors in series with each other having a positively charged terminal of a first one of the two resistors coupled to a negatively charged terminal of a second one of the two resistors is equal to a sum of resistances of the two resistors. In various embodiments, a combined resistance of two resistors in parallel with each other having a positively charged terminal coupled to a first end of the two resistors and having a negatively charged terminal coupled to a second end of the two resistors is equal to a ratio of product of resistances of the two resistors to a sum of resistances of the two resistors.

In various embodiments, a combined impedance of an inductor and a capacitor in series with each other is a sum of an impedance of the inductor and an impedance of the capacitor. In some embodiments, a combined impedance of a resistor and a capacitor in series with each other is a sum of an impedance of the resistor and an impedance of the capacitor. In a number of embodiments, a combined impedance of a resistor and an inductor in series with each other is a sum of an impedance of the resistor and an impedance of the inductor.

In some embodiments, a combined impedance of an inductor and a capacitor in parallel with each other is a ratio of a product of an impedance of the inductor and an impedance of the capacitor over a sum of the impedance of the inductor and the impedance of the capacitor. In various embodiments, a combined impedance of an inductor and a resistor in parallel with each other is a ratio of a product of an impedance of the inductor and an impedance of the resistor over a sum of the impedance of the inductor and the impedance of the resistor. In several embodiments, a combined impedance of an inductor and a capacitor in parallel with each other is a ratio of a product of an impedance of the inductor and an impedance of the capacitor over a sum of the impedance of the inductor and the impedance of the capacitor.

In various embodiments, the module 502 represents an effect of the x and y MHz matching models 302 and 306 (FIG. 5A) in a simplified form on the z MHz matching model 308. For example, the processor 142 (FIG. 1) generates and couples the module 502 in series with the modules 402, 404, and 406 to account for an effect of impedances of the matching models 302 and 306 on an impedance of the z MHz matching model 308. As another example, the processor 142 calculates a combined impedance of the modules 402, 404, 406, and 502 to account for and simplify an effect of impedances of the matching models 302 and 306 on an impedance of the z MHz matching model 308.

Figure 6:
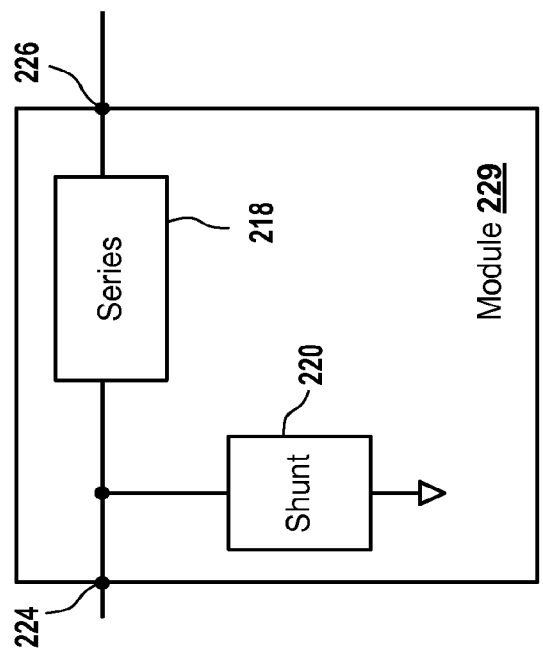
FIG. 6 is a diagram of an embodiment of a module of the impedance matching model to illustrate a change in positions of a shunt circuit and a series circuit of the impedance matching model compared to positions of the shunt and series circuits illustrated in FIG. 3.

FIG. 6 is a diagram of an embodiment of a module 229 that is similar to the module n of FIG. 3 except that positions of the series circuit 218 and the shunt circuit 220 are changed compared to positions of the series circuit 218 and the shunt circuit 220 in the module n. In the module 229, the shunt circuit 220 is placed on an opposite side of the series circuit 218 of the module 229 compared to a side on which the shunt circuit 220 is placed in the module n. The shunt circuit 220 is coupled to the input 224 and to the series circuit 218 and the series circuit 218 is coupled to the output 226. Also, the series circuit 218 is coupled to the input 224. Moreover, the shunt circuit 220 of the module 229 shunts a signal that is received as an input by the series circuit 218 of the module 229. Comparatively, the shunt circuit 220 of the module n shunts a signal that is provided as an output by the series circuit 218 of the module n.

The module 229 is an example of any of the modules N of the impedance matching model 103 (FIG. 2). For example, the module 229 is an example of the module 201 or the module 203 or the module 205.

In some embodiments, the module 229 includes only one series circuit 218 and only one shunt circuit 220.

Figure 7A:
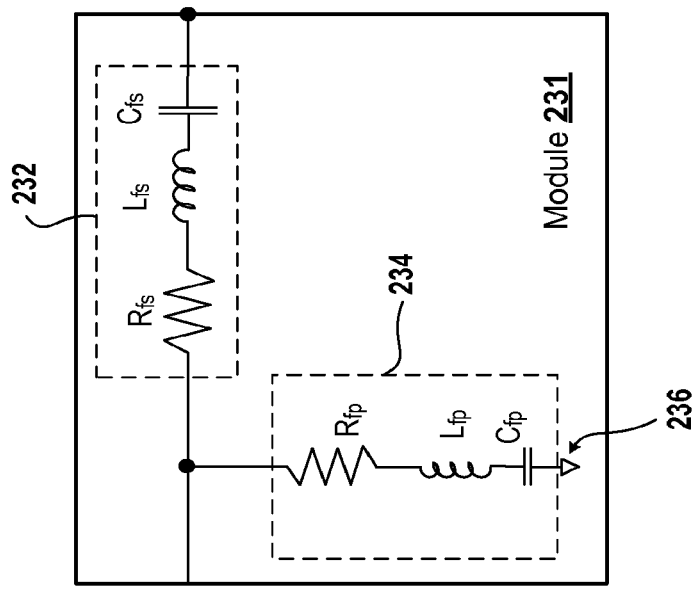
FIG. 7A is a diagram of an embodiment of a diagram of the module of FIG. 6 in which inductors and capacitors have fixed values, in accordance with some embodiments of the present disclosure.

FIG. 7A is a diagram of an embodiment of a module 231, which is an example of the module 229 (FIG. 6). The series RLC circuit 232 of the module 231 is placed on a side of the parallel circuit 234 of the module 231 and the side is opposite to a side on which the series RLC circuit 232 of the module 230 (FIG. 4A) is placed.

Figure 7B:
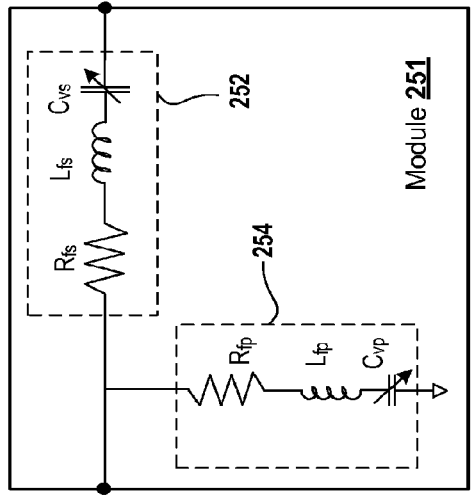
FIG. 7B is a diagram of the module of FIG. 6 in which inductors have variable values, in accordance with several embodiments of the present disclosure.

FIG. 7B is a diagram of an embodiment of a module 241, which is an example of the module 229 (FIG. 6). As shown, the series RLC circuit 242 of the module 241 is placed on a side of the parallel circuit 244 of the module 241 and the side is opposite to a side on which the series RLC circuit 242 of the module 230 (FIG. 4B) is placed.

Figure 7C:
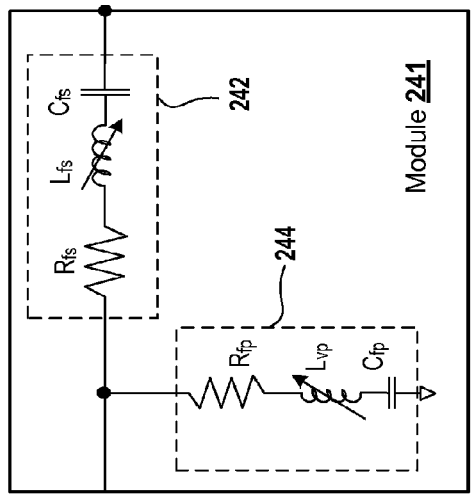
FIG. 7C is a diagram of the module of FIG. 6 in which capacitors have variable values, in accordance with various embodiments of the present disclosure.

FIG. 7C is a diagram of an embodiment of a module 251, which is an example of the module 229 (FIG. 6). The series RLC circuit 252 of the module 251 is placed on a side of the parallel circuit 254 of the module 251 and the side is opposite to a side on which the series RLC circuit 252 of the module 250 (FIG. 4C) is placed.

Figure 7D:
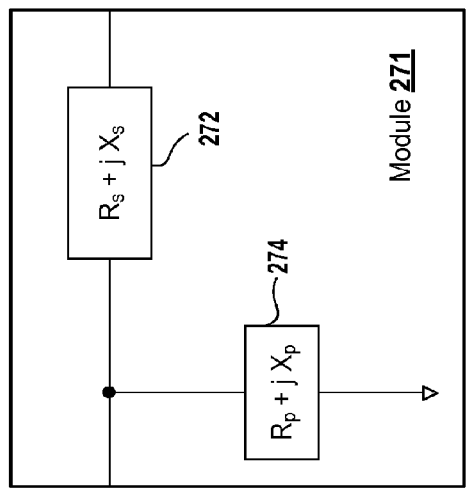
FIG. 7D is a diagram of the module of FIG. 6 in which inductors and capacitors have variable values, in accordance with some embodiments of the present disclosure.

FIG. 7D is a diagram of an embodiment of a module 261, which is an example of the module 229 (FIG. 6). As visible in FIG. 7D, the series RLC circuit 262 of the module 261 is placed on a side of the parallel circuit 264 of the module 261 and the side is opposite to a side on which the series RLC circuit 262 of the module 260 (FIG. 4D) is placed.

Figure 7E:
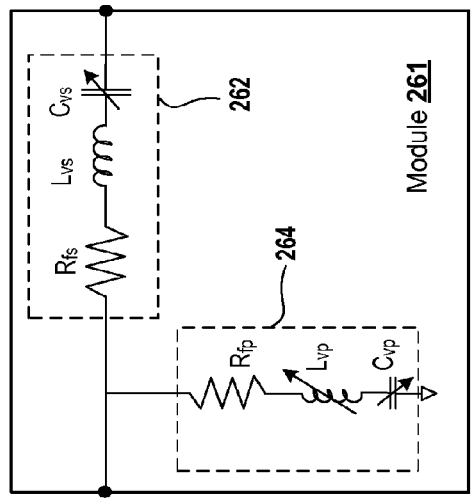
FIG. 7E is a diagram of a module that includes a functional representation of a series circuit of the module of FIG. 6 and a functional representation of a shunt circuit of the module of FIG. 6, in accordance with various embodiments of the present disclosure.

FIG. 7E is a diagram of an embodiment of a module 271, which is an example of the module 229 (FIG. 6). As shown, the function 274 is positioned in the module 271 at a side of the function 272 of the module 271 and the side is opposite to a side on which the function 274 is positioned in the module 270 (FIG. 4E).

In the embodiments described with reference to FIG. 7E, the ground connection 222 (FIG. 3) is referred to as a ground function.

Figure 8:
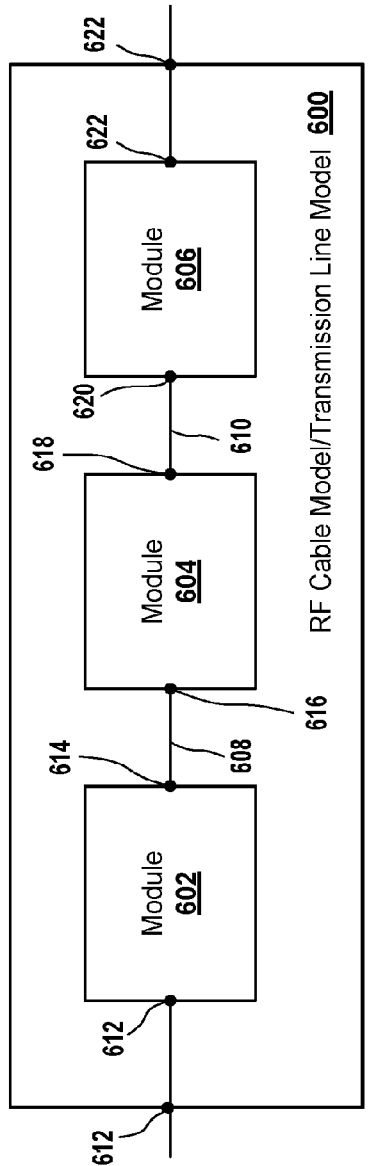
FIG. 8 is a diagram of a segmented cable model generated from the cable model of FIG. 1 or a segmented RF transmission model generated from the RF transmission model of FIG. 1, in accordance with several embodiments of the present disclosure.

FIG. 8 is a diagram of an embodiment of a segmented cable model or a segmented RF transmission model 600, referred to herein as a cable model/RF transmission model 600. The cable model/RF transmission model 600 is an example of a cable model generated by converting, e.g., segmenting, etc., the cable model 104A (FIG. 1), or a cable model generated by converting the cable model 104B (FIG. 1), or a cable model generated by converting the cable model 104C (FIG. 1), or an RF transmission model generated by converting the RF transmission model 106 (FIG. 1).

It should be noted that the cable model generated by converting the cable model 104A may have different number of modules than that of the cable model generated by converting the cable model 104B and that of the cable model generated by converting the cable model 104C. Similarly, the cable model generated by converting the cable model 104B may have different number of modules than that of the cable model cable model generated by converting the cable model 104C. Moreover, it should be noted that the RF transmission model 106 may have a different number of modules than that of the cable model generated by converting the cable model 104A, or the cable model generated by converting the cable model 104B, or the cable model generated by converting the cable model 104C. The cable model/RF transmission model 600 includes one or more modules, e.g., a module 602, a module 604, and a module 606.

In some embodiments, the RF transmission model 600 is generated by converting, e.g., segmenting, etc., the RF transmission model 106, which is a circuit that includes one or more resistors, or one or more capacitors, or one or more inductors, or a combination thereof. In the circuit that includes one or more resistors, or one or more capacitors, or one or more inductors, or a combination thereof, in some embodiments, a capacitor is coupled in series or in parallel to another capacitor, a resistor, or an inductor. In the circuit that includes one or more resistors, or one or more capacitors, or one or more inductors, or a combination thereof, in various embodiments, a resistor is coupled in series or in parallel to another resistor, a capacitor, or an inductor. In the circuit that includes one or more resistors, or one or more capacitors, or one or more inductors, or a combination thereof, in several embodiments, an inductor is coupled in series or in parallel to another inductor, a capacitor, or a resistor.

Similarly, in various embodiments, the cable model 600 is generated by converting, e.g., segmenting, etc., the cable model 104A, 104B, or 104C (FIG. 1), which is a circuit that includes one or more resistors, or one or more capacitors, or one or more inductors, or a combination thereof.

The processor 142 (FIG. 1) segments the RF transmission model 106 into multiple modules 602, 604, and 606. In some embodiments, the processor 142 segments the RF transmission model 106 into any number of modules, e.g., D modules, where D is an integer greater than zero.

Similarly, in various embodiments, the processor 142 (FIG. 1) segments the cable model 104A, 104B, or 104C into multiple modules 602, 604, and 606. In some embodiments, the processor 142 segments the cable model 104A, 104B, or 104C into any number of modules, e.g., E modules, where E is an integer greater than zero.

The processor 142 maintains a coupling between elements of a cable model/RF transmission model after the segmentation of the cable model/RF transmission model into modules 602, 604, and 606. For example, the processor maintains a series connection or a parallel connection between two elements, e.g., a capacitor and an inductor, a resistor and an inductor, a capacitor and a resistor, etc., of the RF transmission model 106 before and after the segmentation. As another example, the processor maintains a series connection or a parallel connection between two elements, e.g., a capacitor and an inductor, a resistor and an inductor, a capacitor and a resistor, etc., of the cable model 104A before and after the segmentation.

The modules 602, 604, and 606 are coupled with each other. For example, the module 602 is coupled to the module 604 via a link 608 and the module 606 is coupled to the module 604 via a link 610.

In embodiments in which the cable model 600 is generated by converting the cable model 104A, 104B, or 104C, the module 602 has an input 612, which is an example of the input 105A, the input 105B, or the input 105C (FIG. 1). Moreover, the module 602 has an output 614, which is coupled to an input 616 of the module 604. Also, the module 604 has an output 618, which is coupled to an input 620 of the module 606. The module 606 has an output 622, which is an example of the input 146A, 146B, or 146C (FIG. 1) of the impedance matching model 102.

It should be noted that in various embodiments, when an output of a cable model is coupled to an input of the impedance matching model 102, the output is represented by the input and vice versa. For example, an output of the cable model 104A is represented by the input 146A, an output of the cable model 104B is represented by the input 146B, and an output of the cable model 104C is represented by the input 146C.

In embodiments in which the RF transmission model 600 is generated by converting the RF transmission model 106 (FIG. 1), the input 612 is an example of the output 148 (FIG. 1) of the impedance matching model 102. It should be noted that in some embodiments, the output 148 is coupled to an input of the RF transmission model 106. In these embodiments, when the output 148 is coupled to the input of the RF transmission model 106, the output 148 also represents the input of the RF transmission model 106. Moreover, the output 622 is an example of the output 150 (FIG. 1) of the RF transmission model 106.

In various embodiments, the cable model/RF transmission model 600 includes modules 602, 604, and 606 per unit length of an RF cable, e.g., the RF cable 124A, or the RF cable 124B, or the RF cable 124C, etc., or per unit length of the RF transmission line 128 (FIG. 1). For example, the processor 142 (FIG. 1) generates one module of the cable model/RF transmission model 600 per unit length of the RF cable 124A, or per unit length of the RF cable 124B, or per unit length of the RF cable 124C, or per unit length of the RF transmission line 128. As another example, when the processor 142 determines that there are 10 unit lengths of the RF transmission line 128, the processor 142 segments an RF transmission model into ten modules. As another example, when the processor 142 determines that there are 12 unit lengths of the RF cable 124A, the processor 142 segments a cable model into twelve modules.

In some embodiments, the processor 142 determines the unit length of an RF cable or an RF transmission line to be less than a fraction of a wavelength of an RF signal that is transferred via the RF cable or the RF transmission line. For example, the unit length is less than 0.1 of a wavelength of an RF signal that is transferred via the RF cable or the RF transmission line. As another example, the unit length is less than a fraction of a wavelength of an RF signal that is transferred via the RF cable or the RF transmission line, where the fraction ranges from 0.1 to 0.2.

Figure 9:
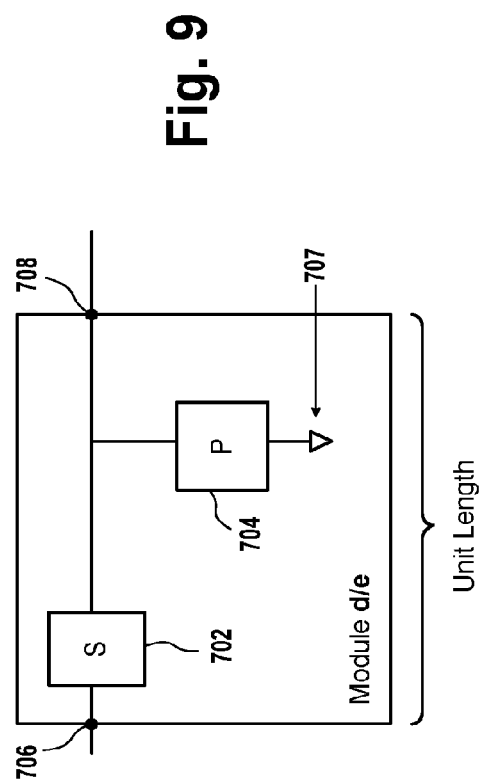
FIG. 9 is a diagram of a module of the RF cable model/ Transmission line model of FIG. 8, in accordance with some embodiments of the present disclosure.

FIG. 9 is a diagram of an embodiment of a module d/e, e.g., module d or module e, etc., of the RF cable model/Transmission line model 600 (FIG. 8), where d ranges from 1 thru D and e ranges from 1 thru E. The module d/e includes a series circuit 702 and a shunt circuit 704. In some embodiments, the module d/e includes only one series circuit 702 and only one shunt circuit 704. The shunt circuit 704 is coupled to a ground connection 707.

The module d/e has an input 706, which is an example of the input 612, the input 616, or the input 620 (FIG. 8). Moreover, the module d/e has an output 708, which is an example of the output 614, the output 618, or the output 622 (FIG. 8).

As shown, the series circuit 702 is coupled to the input 706 and to the output 708. Moreover, the shunt circuit 704 is coupled to the output 708.

In various embodiments, the series circuit 702 or the shunt circuit 704 includes a resistor coupled in series with an inductor and a capacitor. In some embodiments, the series circuit 702 or the shunt circuit 704 includes a resistor coupled in series with an inductor or in series with a capacitor. In several embodiments, the series circuit 702 or the shunt circuit 704 includes an inductor coupled in series with a capacitor. In several embodiments, the series circuit 702 or the shunt circuit 704 includes an inductor, a resistor, or a capacitor.

In some embodiments, an impedance function is used instead of the series circuit 702 and an impedance function is used instead of the shunt circuit 704. The impedance function that is used instead of the series circuit 702 represents a directional sum of impedances of all elements of the series circuit 702. For example, the series circuit 702 is represented as $R_{sx}+jX_{sx}$, where $R_{sx}$ is a result of a directional sum of resistances of all elements of the series circuit 702, and $X_{sx}$ is a result of a directional sum of reactances of all elements of the series circuit 702. Moreover, the impedance function that is used instead of the shunt circuit 704 represents a directional sum of resistances of all elements of the shunt circuit 704 and a directional sum of reactances of all elements of the shunt circuit 704. For example, the shunt circuit 704 is represented as $R_{px}+jX_{px}$, where $R_{px}$ is a result of a directional sum of resistances of all elements of the shunt circuit 704, and $X_{px}$ is a result of a directional sum of reactances of all elements of the shunt circuit 704.

In some embodiments, the processor 142 (FIG. 1) determines an impedance $Z_{(f+1)-in}$ at an input, e.g., as seen from an input, etc., of an $(f+1)^{th}$ module of the RF cable model/Transmission line model 600 based on an impedance $Z_{f\text{-}in}$ at an input, e.g., as seen from an input, etc., of an $f^{th}$ module of the RF cable model/Transmission line model 600 and parameters of the $f^{th}$ module, where f is d or e. For example, the processor 142 determines the impedance $Z_{(f+1)\text{-}in}$ according to a function:

$$Z_{(f+1)-in} = R_0 \frac{Z_{f-in} + R_0\tan(\beta l)}{R_0 + Z_{f-in}\tan(\beta l)} \quad (7)$$

where l is a length of the corresponding RF transmission line 128, the RF cable 124A, the RF cable 124B, or the RF cable 124C for which the impedance $Z_{(f+1)\text{-}in}$ is calculated, $R_0$ and $\beta$ are properties of the RF transmission line 128, the RF cable 124A, the RF cable 124B, or the RF cable 124C. For example, $R_0$ is the characteristic resistance of the RF transmission line 128, the RF cable 124A, the RF cable 124B, or the RF cable 124C. The processor 142 determines the property $R_0$ as being equal to a function:

$$R_0 = \sqrt{\frac{j\omega L}{j\omega C}} \quad (8)$$

where $\omega$ is equal to $2\pi*$frequency, where frequency is a frequency of an RF generator, "L" is an inductance of the series circuit 702 (FIG. 9) and "C" is a capacitance of the shunt circuit 704. The processor 142 determines the parameter $\beta$ as being equal to a ratio of a product of 2 and $\pi$ over a wavelength $\lambda$ of an RF signal transferring via the RF transmission line 128, the RF cable 124A, the RF cable 124B, or the RF cable 124C. In some embodiments, a voltage and current probe (not shown) is coupled to the RF transmission line 128, the RF cable 124A, the RF cable 124B, or the RF cable 124C to provide a complex voltage and current of an RF signal that transfers via the RF transmission line 128, the RF cable 124A, the RF cable 124B, or the RF cable 124C to the processor 142 and the processor 142 determines the wavelength from the complex voltage and current. The processor 142 is coupled to the voltage and current probe (not shown).

In some embodiments, the processor 142 calculates the impedance $Z_{f\text{-}in}$ at the input 612 (FIG. 8) based on a complex voltage and current received via the processor 142 from the probe 108 (FIG. 1). For example, when the $f^{th}$ module is a first module of the RF cable model 600, the processor 142 calculates the impedance $Z_{f\text{-}in}$ at the input 612 as a ratio of the complex voltage received via the processor 142 from the probe 108 and the complex current received via the processor 142 from the probe 108.

In various embodiments, the processor 142 calculates the impedance $Z_{f\text{-}in}$ at the input 612 (FIG. 8) based on a complex voltage and current received via the processor 142 from the probe 108 (FIG. 1). For example, when the $f^{th}$ module is a first module of the RF transmission model 600, the processor 142 calculates the impedance $Z_{f\text{-}in}$ at the input 612 as a ratio of a complex voltage determined at the input 612 and a complex current determined at the input 612. The complex voltage at the input 612 is determined by the processor 142 as a directed sum of a complex voltage received from the probe 108, a complex voltage determined from characteristics of the cable model 104A, and a complex voltage determined from characteristics of the impedance matching model 102 (FIG. 1). The complex current at the input 612 is determined by the processor 142 as a directed sum of a complex current received from the probe 108, a complex current determined from characteristics of the cable model 104A, and a complex current determined from characteristics of the impedance matching model 102 (FIG. 1).

To generate a cable model/RF transmission model of another RF cable/RF transmission line (not shown), e.g., a circuit that replaces and is other than that of RF cable 124A, or a circuit that replaces and is other than that of RF cable 124B, or a circuit that replaces and is other than that of RF cable 124C, or a circuit that replaces and is other than that of RF transmission line 128 (FIG. 1), etc., the processor 142 replaces the module 602 with another module (not shown), replaces the module 604 with another module (not shown), and/or replaces the module 606 with another module (not shown). The processor 142 establishes a series link between the replacement modules and unreplaced modules, e.g., the module 602, 604, or 606, etc., when all of the modules 602, 604 and 606 are not replaced or establishes a series link between the replacement modules when all of the modules 602, 604 and 606 are replaced by the replacement modules.

A series combination of the other modules (not shown) that replaces the corresponding modules 602, 604, and/or 606 has similar characteristics as that of the other replacement RF cable/RF transmission line (not shown). For example, a combined impedance of the other modules (not shown) is the same as or within a range of an impedance of the other RF cable/RF transmission line (not shown). In this example, the other modules (not shown) represent the other RF cable/RF transmission line (not shown). As another example, a combined impedance of one of the other replacement modules (not shown), the module 604, and the module 606 is the same as or within a range of an impedance of the other RF cable/RF transmission line (not shown). In this example, the one of the other replacement modules (not shown), the module 604, and the module 606 represent the other RF cable/RF transmission line (not shown). Modularity of RF cable/RF transmission lines allows easy replacement of one or more modules of one of the RF cable/RF transmission lines with one or more modules of another one of the RF cable/RF transmission lines.

Upon replacing the module 602 with another module (not shown), replacing the module 604 with another module (not shown), and/or replacing the module 606 with another module, the processor 142 checks whether characteristics, e.g., impedance, complex voltage and current, etc., of a cable model/RF transmission model that includes one or more of the replacement modules (not shown) and/or one or more of the modules 602, 604, and 606 are similar to characteristics, e.g., impedance, complex voltage and current, etc., of the other RF cable/RF transmission line (not shown). For example, the processor 142 calculates a combined impedance of the replacement modules (not shown) and/or one or more of the modules 602, 604, and 606 and compares the combined impedance with an impedance of the other replacement RF cable/RF transmission line (not shown). Upon determining that the combined impedance of the replacement modules (not shown) and/or one or more of the modules 602, 604, and 606 matches with or is within a range of the impedance of the other replacement RF cable/RF transmission line (not shown), the processor 142 determines that characteristics of the cable model/RF transmission model that includes one or more of the replacement modules (not shown) and/or one or more of the modules 602, 604, and 606 are similar to characteristics of the other RF cable/RF transmission line (not shown). On the other hand, upon determining that the combined impedance of the replacement modules (not shown) and/or one or more of the modules 602, 604, and 606 do not match with or are not within a range of the impedance of the other replacement RF cable/RF transmission line (not shown), the processor 142 determines that characteristics of the cable model/RF transmission model that includes one or more of the replacement modules (not shown) and/or one or more of the modules 602, 604, and 606 are not similar to characteristics of the other RF cable/RF transmission line (not shown).

In various embodiments, the impedance of the other replacement RF cable/RF transmission line is received by the processor 142 from another processor. In some embodiments, the impedance of the other replacement RF cable/RF transmission line is calculated by the processor 142 based on complex voltages and currents measured at an input and at an output of the other replacement RF cable/RF transmission line.

In some embodiments, the series circuit 702 is placed to the right of the shunt circuit 704. For example, the series circuit 702 is coupled to the input 706, the shunt circuit 704, and to the output 708. Moreover, the shunt circuit 704 is coupled to the input 706 and to the ground connection 706. As another example, the shunt circuit 704 shunts a signal that is received as an input by the series circuit 702. Comparatively, the shunt circuit 704 of the module d/e shunts a signal that is provided as an output by the series circuit 702. These embodiments are similar to the embodiments of the module 229 illustrated with respect to FIG. 6.

Figure 10A:
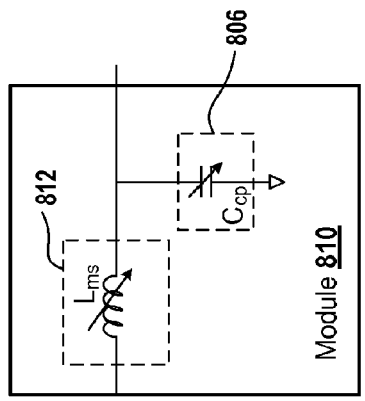
FIG. 10A is a diagram of the module of FIG. 9 in which an inductance of an inductor and a capacitance of a capacitor are fixed, in accordance with various embodiments of the present disclosure.

FIG. 10A is a diagram of an embodiment of a module 802, which is an example of the module d/e (FIG. 9). The module 802 includes a series inductor circuit 804 and a parallel capacitor circuit 806. The series inductor circuit 804 is an example of the series circuit 702 (FIG. 9) and the parallel capacitor circuit 806 is an example of the shunt circuit 704 (FIG. 9).

The series inductor circuit 804 includes an inductor $L_{cs}$. The parallel capacitor circuit 806 includes a capacitor $C_{cp}$. The capacitor $C_{cp}$ is coupled to a ground connection 808.

Values of the inductor Lcs and the capacitor $C_{cp}$ are fixed.

Figure 10B:
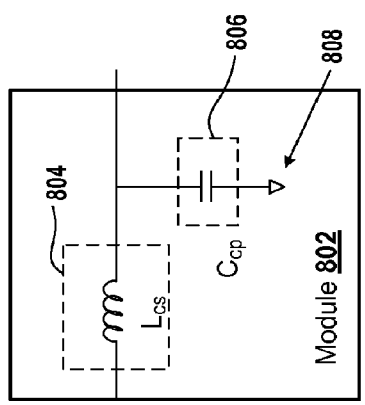
FIG. 10B is a diagram of a module of FIG. 9 in which an inductance of an inductor is variable, in accordance with several embodiments of the present disclosure.

FIG. 10B is a diagram of an embodiment of a module 810 in which an inductance of an inductor $L_{ms}$ is variable. The module 810 is an example of the module d/e (FIG. 9). The module 810 includes a series inductor circuit 812 and the parallel capacitor circuit 806. The series inductor circuit 812 is an example of the series circuit 702 (FIG. 10A). The series inductor circuit 812 includes the variable inductor $L_{ms}$. The module 810 is the same as the module 802 (FIG. 10A) except that in the module 810, the fixed inductor $L_{cs}$ is replaced with the variable inductor $L_{ms}$.

Figure 10C:
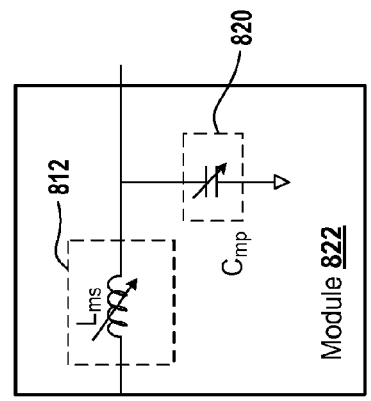
FIG. 10C is a diagram of a module of FIG. 9 in which a capacitance of a capacitor is variable, in accordance with several embodiments of the present disclosure.

FIG. 10C is a diagram of an embodiment of a module 816 in which a capacitance of a capacitor $C_{mp}$ is variable. The module 816 is an example of the module d/e (FIG. 9). The module 816 includes the series inductor circuit 804 and a parallel capacitor circuit 820. The parallel capacitor circuit 820 is an example of the shunt circuit 704 (FIG. 9). The parallel capacitor circuit 820 includes the variable capacitor $C_{mp}$. The module 816 is the same as the module 802 (FIG. 10A) except that in the module 816, the fixed capacitor $C_{cp}$ is replaced with the variable capacitor $C_{mp}$.

Figure 10D:
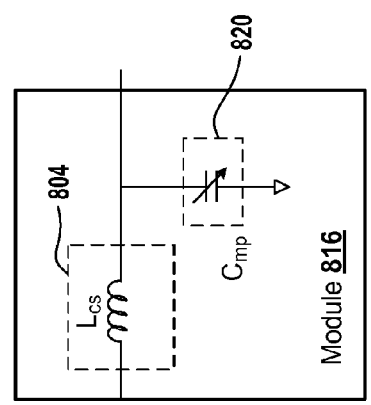
FIG. 10D is a diagram of a module of FIG. 9 in which an inductance of an inductor and a capacitance of a capacitor are variable, in accordance with several embodiments of the present disclosure.

FIG. 10D is a diagram of an embodiment of a module 822 in which an inductance of the inductor $L_{ms}$ and a capacitance of the capacitor $C_{mp}$ are variable. The module 822 is an example of the module d/e (FIG. 9). The module 822 includes the series inductor circuit 812 and the parallel capacitor circuit 820. The module 822 is the same as the module 802 (FIG. 10A) except that in the module 822, the fixed inductor $L_{cs}$ is replaced with the variable inductor $L_{ms}$ and the fixed capacitor $C_{cp}$ is replaced with the variable capacitor $C_{mp}$.

In some embodiments, a value of inductance of the inductor $L_{cs}$ is zero and/or a value of capacitance of the $C_{cp}$ is zero. In various embodiments, a value of inductance of the inductor $L_{ms}$ is zero and/or a value of capacitance of the $C_{mp}$ is zero.

Figure 10E:
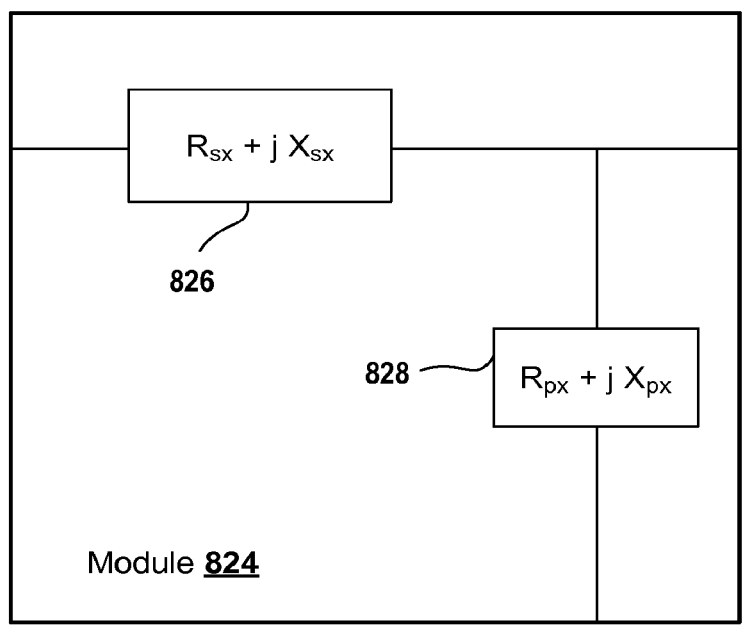
FIG. 10E is a diagram of a module that represents a function applied by a series circuit of the module of FIG. 9 and a function that is applied by a shunt circuit of the module of FIG. 9, in accordance with various embodiments of the present disclosure.

FIG. 10E is a diagram of an embodiment of a module 824 that represents a function 826 applied by the series circuit 702 (FIG. 9) and a function 828 that is applied by the shunt circuit 704 (FIG. 9). The function 826 is the mathematical function $R_{sx}+jX_{sx}$ and the function 828 is the mathematical function $R_{px}+jX_{px}$. The function 828 is a shunt function that shunts a current output by the function 826.

In the embodiments described with reference to FIG. 10E, the ground connection 707 (FIG. 9) is referred to as a ground function.

Figure 11A:
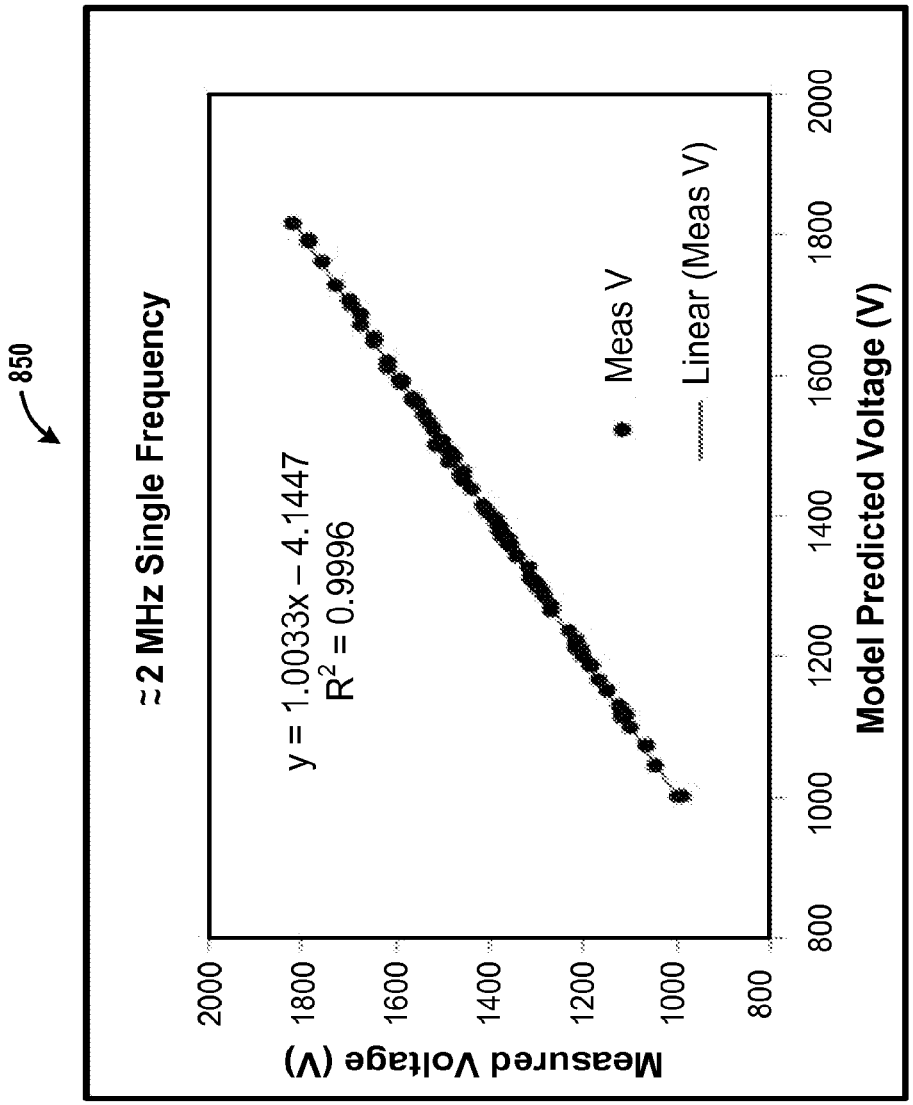
FIG. 11A is a graph that illustrates a linear relationship between a voltage measured at an output of an impedance matching circuit and a modeled voltage at an output of a corresponding segmented impedance matching model, in accordance with some embodiments of the present disclosure.

FIG. 11A is an embodiment of a graph 850 that illustrates a linear relationship between a voltage measured at an output of an impedance matching circuit and a modeled voltage at an output of a corresponding segmented impedance matching model. For example, a voltage and current probe is coupled to the output of an impedance matching circuit to measure a voltage at the output. The modeled voltage is plotted along an x-axis and the measured voltage is plotted along a y-axis. The modeled voltage may be the voltage $V_{n-out}$. As shown, there is a linear relationship between the modeled voltage and the measured voltage. Moreover, in some embodiments, the linear relationship in the graph 850 is achieved after the processor 142 (FIG. 1) modifies values of a resistor, an inductor, and/or a capacitor in the series circuit 218 (FIG. 3) and/or after the processor 142 modifies values of a resistor, an inductor, and/or a capacitor in the shunt circuit 220 (FIG. 3).

Figure 11B:
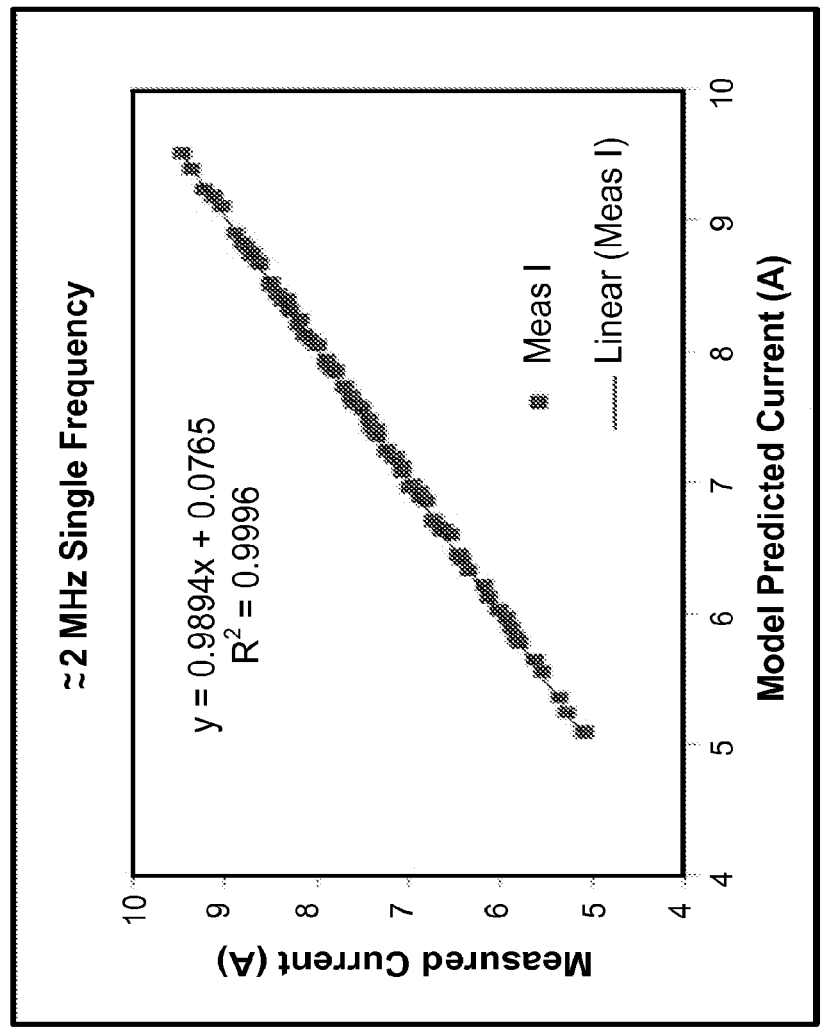
FIG. 11B is a graph that illustrates a linear relationship between a current measured at an output of an impedance matching circuit and a modeled current at an output of a corresponding segmented impedance matching model, in accordance with various embodiments of the present disclosure.

FIG. 11B is an embodiment of a graph 852 that illustrates a linear relationship between a current measured at an output of an impedance matching circuit and a modeled current at an output of a corresponding segmented impedance matching model. For example, a voltage and current probe is coupled to the output of an impedance matching circuit to measure a current at the output. The modeled current is plotted along an x-axis and the measured current is plotted along a y-axis. The modeled current may be the current $I_{n-out}$. As shown, there is a linear relationship between the modeled current and the measured current. Moreover, in some embodiments, the linear relationship in the graph 852 is achieved after the processor 142 (FIG. 1) modifies values of a resistor, an inductor, and/or a capacitor in the series circuit 218 (FIG. 3) and/or after the processor 142 modifies values of a resistor, an inductor, and/or a capacitor in the shunt circuit 220 (FIG. 3).

FIG. 12A is an embodiment of a graph 854 that illustrates a relationship between a voltage measured at an output of an impedance matching circuit with respect to time and a modeled voltage at an output of an impedance matching model that is generated based on the impedance matching circuit with respect to time. The measured voltage and the modeled voltage are plotted along a y-axis and time is plotted on an x-axis. As shown, the modeled voltage overlaps with the measured voltage.

FIG. 12B is an embodiment of a graph 856 that illustrates a relationship between a current measured at an output of an impedance matching circuit with respect to time and a modeled current at an output of an impedance matching model that is generated based on the impedance matching circuit with respect to time. The measured current and the modeled current are plotted along a y-axis and time is plotted on an x-axis. As shown, the modeled current overlaps with the measured current.

When one of the x, y, and z MHz RF generators is on, e.g., powered on, etc., and the remaining of the x, y, and z MHz RF generators are off, the processor 142 applies a projected complex voltage and current determined at the output 150 (FIG. 1) as an input to a function to map the projected complex voltage and current to a wafer bias value at the output 150. For example, when the x, y, or z MHz RF generator is on, a wafer bias at the output 150 is determined as a sum of a first product $a1*V$, a second product $b1*I$, a third product $c1*sqrt(P)$, and a constant d1, where "sqrt" is square root, V is a voltage magnitude of the projected complex voltage and current at the output 150, I is a current magnitude of the projected complex voltage and current at the output 150, P is a power magnitude of the projected complex voltage and current at the output 150, a1, b1, and c1 are coefficients, and d1 is a constant. The processor 142 determines the projected complex voltage and current at the output 150 when the x, y, or z MHz RF generator is on based on the complex voltage and current received at the corresponding input 105A, 105B, or 105C from a corresponding voltage and current probe that is coupled to the x, y, or z MHz RF generator, an impedance of the corresponding cable model 600 (FIG. 8) that receives the complex voltage and current from the corresponding voltage and current probe, an impedance of the impedance matching model 103 (FIG. 2), and an impedance of the RF transmission model 600 (FIG. 8).

Moreover, when two of the x, y, and z MHz RF generators are on and the remaining of the x, y, and z MHz RF generators are off, the processor 142 calculates a wafer bias at the output 150 as a sum of a first product $a12*V1$, a second product $b12*I1$, a third product $c12*sqrt(P1)$, a fourth product $d12*V2$, a fifth product $e12*I2$, a sixth product $f12*sqrt(P2)$, and a constant g12, where V1 is a voltage magnitude at the output 150 as a result of a first one of the two RF generators being on, I1 is a current magnitude at the output 150 as a result of the first RF generator being on, P1 is a power magnitude at the output 150 as a result of the first RF generator being on, V2 is a voltage magnitude at the output 150 as a result of a second one of the two RF generators being on, I2 is a current magnitude at the output 150 as a result of the second RF generator being on, and P2 is a power magnitude at the output 150 as a result of the second RF generator being on, a12, b12, c12, d12, e12, and f12 are coefficients, and g12 is a constant.

As yet another example, when all of the x, y, and z MHz RF generators are on, the processor 142 calculates a wafer bias at the output 150 as a sum of a first product $a123*V1$, a second product $b123*I1$, a third product $c123*sqrt(P1)$, a fourth product $d123*V2$, a fifth product $e123*I2$, a sixth product $f123*sqrt(P2)$, a seventh product $g123*V3$, an eighth product $h123*I3$, a ninth product $i123*sqrt(P3)$, and a constant j123, where V1, I1, P1, V2, I2, and P2 are described above in the preceding example, V3 is a voltage magnitude at the output 150 as a result of a third one of the RF generators being on, I3 is a current magnitude at the output 150 as a result of the third RF generator being on, and P3 is a power magnitude at the output 150 as a result of the third RF generator being on, a123, b123, c123, d123, e123, f123, g123, h123, and i123 are coefficients and j123 is a constant.

In some embodiments, a function used to determine a wafer bias is a sum of characterized values and a constant. The characterized values include magnitudes, e.g., the magnitudes V, I, P, V1, I1, P1, V2, I2, P2, V3, I3, P3, etc. The characterized values also include coefficients, e.g., the coefficients, a1, b1, c1, a12, b12, c12, d12, e12, f12, a123, b123, c123, d123, e123, f123, g123, h123, i123, etc. Examples of the constant include the constant d1, the constant g12, the constant j123, etc.

It should be noted that the coefficients of the characterized values and the constant of the characterized values incorporate empirical modeling data. For example, wafer bias is measured for multiple times within the plasma chamber 130 (FIG. 1) by using a wafer bias sensor. Moreover, in the example, for the number of times the wafer bias is measured, complex voltages and currents at output 150 are determined by the processor 142 based on the complex voltage and current from one or more of the outputs, e.g., the output 110, 114, 118 (FIG. 1), etc., of one or more of the RF generators, e.g., the x MHz RF generator, the y MHz RF generator, the z MHz RF generator, etc., based on an impedance of the cable model 600 (FIG. 8), an impedance of the impedance matching model 103 (FIG. 2), and an impedance of the RF transmission model 600 (FIG. 8). Moreover, in this example, a statistical method, e.g., partial least squares, best fit, fit, regression, etc., is applied by the processor 142 to the measured wafer bias and to voltage magnitudes, current magnitudes, and power magnitudes extracted from the complex voltages and currents at the output 150 to determine the coefficients of the characterized values and the constant of the characterized values.

In some embodiments, a function used to determine a wafer bias is a polynomial.

It is noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator, the y MHz RF generator, and the z MHz RF generator are coupled to an inductor within the ICP plasma chamber.

It is also noted that although the operations above are described as being performed by the processor 142 (FIG. 1), in some embodiments, the operations may be performed by one or more processors of the host system 143 or by multiple processors of multiple host systems.

It should be noted that although the above-described embodiments relate to providing an RF signal to the lower electrode of the ESC 132 (FIG. 1) and grounding the upper electrode 134 (FIG. 1), in several embodiments, the RF signal is provided to the upper electrode 134 while the lower electrode of the ESC 132 is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A system for segmenting an impedance matching model, the method comprising:
    a radio frequency (RF) generator configured to generate an RF signal;
    an impedance matching circuit coupled to the RF generator via an RF cable, wherein the impedance matching circuit is configured to receive the RF signal and generate a modified RF signal;
    a plasma chamber coupled to the impedance matching circuit via an RF transmission line to receive the modified RF signal; and
    a host computer in communication with the RF generator, wherein the host computer is configured to:
        generate the impedance matching model representing the impedance matching circuit, wherein the impedance matching model includes a first module for a portion of the impedance matching circuit; and
        replace the first module with one or more other modules when the impedance matching circuit is replaced with another impedance matching circuit.

2. The system of claim 1, wherein the first module includes a series circuit.

3. The system of claim 2, wherein the series circuit includes a combination of a resistor, a capacitor, and an inductor.

4. The system of claim 2, wherein the first module is coupled to a second module, wherein the second module is coupled between the first module and a computer-generated model of the RF cable, wherein the series circuit has a first end that is coupled to the second module, wherein the series circuit has a second end that is coupled to a computer-generated model of the RF transmission line.

5. The system of claim 2, wherein the first module is coupled to a second module, wherein the second module is located between the first module and a computer-generated model of the RF transmission line, wherein the series circuit has a first end that is coupled to a computer-generated model of the RF cable and has a second end that is coupled to the second module.

6. The system of claim 1, wherein the first module includes a shunt circuit having a first end that is coupled to a ground connection.

7. The system of claim 6, wherein the shunt circuit includes a combination of a resistor, a capacitor, and an inductor.

8. The system of claim 6, wherein the first module is coupled to a second module, wherein the second module is coupled between the first module and a computer-generated model of the RF cable, wherein the shunt circuit has a second end that is coupled to the second module and to a computer-generated model of the RF transmission line.

9. The system of claim 6, wherein the first module is coupled to a second module, wherein the second module is coupled between the first module and a computer-generated model of the RF transmission line, wherein the shunt circuit has a second end that is coupled to the second module and to a computer-generated model of the RF cable.

10. The system of claim 1, wherein the first module is a polynomial function defining a series circuit.

11. The system of claim 10, wherein the polynomial function includes a combination of a resistance and a reactance.

12. The system of claim 1, wherein the first module is a polynomial function defining a shunt circuit.

13. The system of claim 12, wherein the polynomial function includes a combination of a resistance and a reactance.

14. The system of claim 1, wherein the one or more other modules represent a portion of another impedance matching circuit.

15. A host computer for segmenting an impedance matching model, comprising:
    a processor configured to:
        generate the impedance matching model, the impedance matching model representing an impedance matching circuit, the impedance matching circuit configured to be coupled to a radio frequency (RF) generator via an RF cable and to a plasma chamber via an RF transmission line, wherein the impedance matching model includes a first module for a portion of the impedance matching circuit; and
        replace the first module with one or more other modules when the impedance matching circuit is replaced with another impedance matching circuit; and
    a memory device coupled to the processor for storing the impedance matching model.

16. The host computer of claim 15, wherein the first module is a function or a circuit.

17. The host computer of claim 15, wherein the first module includes a series circuit.

18. The host computer of claim 17, wherein the series circuit includes a combination of a resistor, a capacitor, and an inductor.

19. The host computer of claim 17, wherein the first module is coupled to a second module, wherein the second module is coupled between the first module and a computer-generated model of the RF cable, wherein the series circuit has a first end that is coupled to the second module, wherein the series circuit has a second end that is coupled to a computer-generated model of the RF transmission line.

20. The host computer of claim 17, wherein the first module is coupled to a second module, wherein the second module is located between the first module and a computer-generated model of the RF transmission line, wherein the series circuit has a first end that is coupled to a computer-generated model of the RF cable and has a second end that is coupled to the second module.

21. The host computer of claim 15, wherein the first module includes a shunt circuit having a first end that is coupled to a ground connection.

22. The host computer of claim 21, wherein the shunt circuit includes a combination of a resistor, a capacitor, and an inductor.

23. The host computer of claim 21, wherein the first module is coupled to a second module, wherein the second module is coupled between the first module and a computer-generated model of the RF cable, wherein the shunt circuit has a second end that is coupled to the second module and to a computer-generated model of the RF transmission line.

24. The host computer of claim 21, wherein the first module is coupled to a second module, wherein the second module is coupled between the first module and a computer-generated model of the RF transmission line, wherein the shunt circuit has a second end that is coupled to the second module and to a computer-generated model of the RF cable.

25. The host computer of claim 15, wherein the first module is a polynomial function defining a series circuit.

26. The host computer of claim 25, wherein the polynomial function includes a combination of a resistance and a reactance.

27. The host computer of claim 15, wherein the first module is a polynomial function defining a shunt circuit.

28. The host computer of claim 27, wherein the polynomial function includes a combination of a resistance and a reactance.

29. The host computer of claim 15, wherein the one or more other modules represent a portion of the other impedance matching circuit.

* * * * *